United States Patent
Kiyokawa et al.

(10) Patent No.: US 8,513,962 B2
(45) Date of Patent: Aug. 20, 2013

(54) WAFER TRAY AND TEST APPARATUS

(75) Inventors: Toshiyuki Kiyokawa, Saitama (JP); Yoshiharu Umemura, Kanagawa (JP)

(73) Assignee: Advantest Corporation, Tokyo (JP)

( * ) Notice: Subject to any disclaimer, the term of this patent is extended or adjusted under 35 U.S.C. 154(b) by 249 days.

(21) Appl. No.: 12/881,137

(22) Filed: Sep. 13, 2010

(65) Prior Publication Data

US 2011/0043237 A1 Feb. 24, 2011

Related U.S. Application Data

(63) Continuation of application No. PCT/JP2009/003831, filed on Aug. 7, 2009.

(51) Int. Cl.
*G01R 31/00* (2006.01)

(52) U.S. Cl.
USPC ............. 324/750.2; 324/756.01; 324/756.03

(58) Field of Classification Search
USPC ....................................................... 324/750.2
See application file for complete search history.

(56) References Cited

U.S. PATENT DOCUMENTS

| | | | | |
|---|---|---|---|---|
| 4,164,704 | A * | 8/1979 | Kato et al. | 324/72.5 |
| 4,583,042 | A * | 4/1986 | Riemer | 324/519 |
| 4,693,211 | A * | 9/1987 | Ogami et al. | 118/725 |
| 6,084,215 | A * | 7/2000 | Furuya et al. | 219/444.1 |
| 6,124,725 | A * | 9/2000 | Sato | 324/754.03 |
| 6,781,395 | B2 * | 8/2004 | Maruyama et al. | 324/758.01 |
| 6,828,810 | B2 * | 12/2004 | Kanamaru et al. | 324/750.25 |
| 6,836,322 | B2 * | 12/2004 | Bae | 356/237.4 |
| 7,091,733 | B2 * | 8/2006 | Takekoshi et al. | 324/750.03 |
| 7,670,646 | B2 * | 3/2010 | Ahn et al. | 427/255.32 |
| 2003/0122550 | A1 * | 7/2003 | Kanamaru et al. | 324/537 |
| 2004/0183561 | A1 | 9/2004 | Takekoshi et al. | |
| 2005/0253575 | A1 | 11/2005 | Takekoshi et al. | |
| 2006/0139042 | A1 * | 6/2006 | Kasukabe | 324/754 |

FOREIGN PATENT DOCUMENTS

| | | |
|---|---|---|
| JP | H8-005666 A | 1/1996 |
| JP | H8-115954 A | 5/1996 |
| JP | 2001-077160 A | 3/2001 |
| JP | 2001-203244 A | 7/2001 |
| JP | 2003-077559 A | 3/2003 |
| JP | 2003-168709 A | 6/2003 |
| JP | 2006-186120 A | 7/2006 |
| JP | 2009-099630 A | 5/2009 |

OTHER PUBLICATIONS

The explanation of circumstances concerning the accelerated examination dated Aug. 12, 2009, PCT/JP2009/003831 (parent application) submitted to Japanese Patent Office. Concise Explanation of Relevance.
International Search Report (ISR) issued in PCT/JP2009/003831 (parent application) mailed in Nov. 2009 for Examiner consideration.
Written Opinion (PCT/ISA/237) issued in PCT/JP2009/003831 mailed in Nov. 2009.

* cited by examiner

*Primary Examiner* — Richard Isla Rodas

(57) ABSTRACT

In order to shorten testing time of a plurality of devices under test formed on a semiconductor wafer, a wafer tray used by a test apparatus performing the test is provided. The wafer tray includes a first flow passage for fixing the semiconductor wafer to the wafer tray using vacuum suction, a second flow passage for fixing the wafer tray to the test apparatus using vacuum suction, and a heater for heating a loading surface on which at least the semiconductor wafer is loaded. By using this wafer tray, the semiconductor wafer, which is the object being tested, can be smoothly attached to and detached from different test heads, and testing can be begun quickly after the semiconductor wafer is attached to a test head.

13 Claims, 27 Drawing Sheets

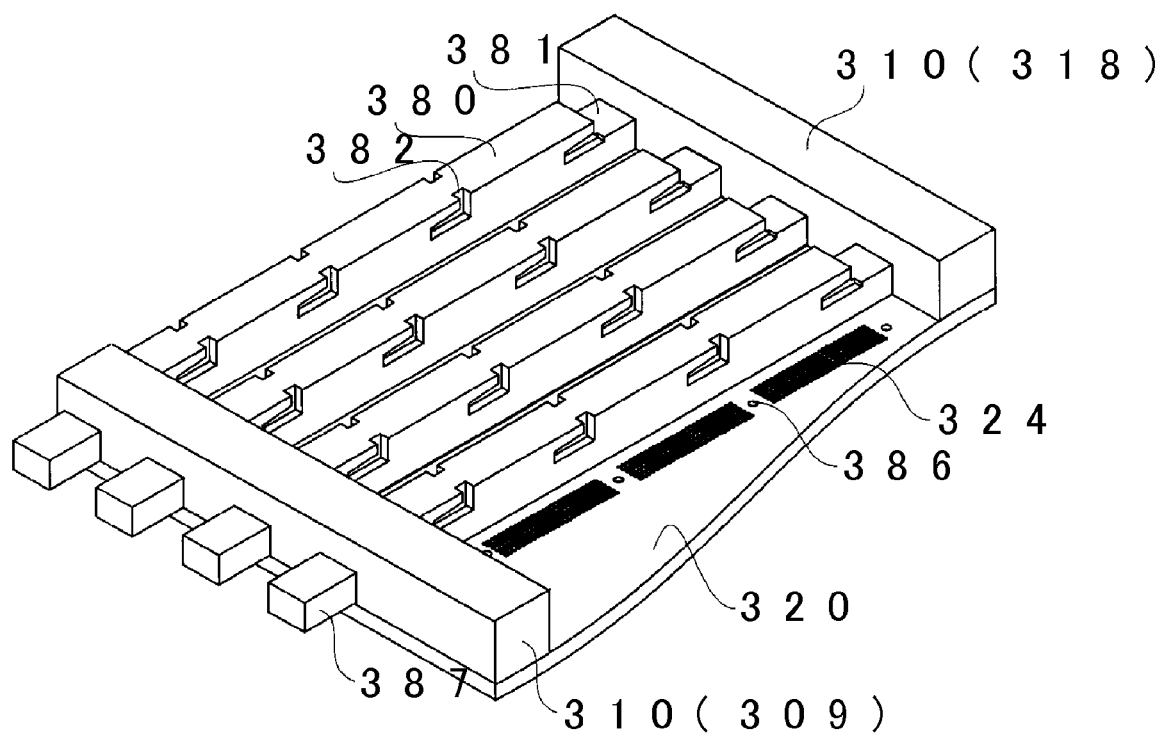
F I G . 26

WAFER TRAY AND TEST APPARATUS

BACKGROUND

1. Technical Field

The present invention relates to a wafer tray and a test apparatus.

2. Related Art

Patent Document 1 discloses an examination apparatus that examines an object under examination by loading the object under examination onto a stage and aligning the object under examination with probe electrodes by using a CCD camera to observe alignment marks on the object under examination. In this way, the examination apparatus attempts to shorten the time needed to examine the object under examination.

Patent Document 1: Japanese Patent Application Publication No. H08-115954

The circuit size of devices under test formed on semiconductor wafers is increasing every year. Therefore, many different tests are necessary and the demand is increasing for the ability to perform a plurality of tests with different conditions on a single semiconductor wafer. In order to decrease overall testing time when performing different tests, the smooth attaching and detaching of semiconductor wafers among different test heads and quick initiation of testing after attachment are desired.

SUMMARY

Therefore, it is an object of an aspect of the innovations herein to provide a wafer tray and a test apparatus, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, provided is a wafer tray that is used by a test apparatus for testing a plurality of devices under test formed on a semiconductor wafer, the wafer tray comprising a first flow passage for fixing the semiconductor wafer to the wafer tray using vacuum suction; a second flow passage for fixing the wafer tray to the test apparatus using vacuum suction; and a heater for heating a loading surface on which at least the semiconductor wafer is loaded.

According to a second aspect related to the innovations herein, provided is the wafer tray of the first aspect, further comprising a third flow passage that circulates a thermal medium or a cooling medium for cooling at least the loading surface.

According to a third aspect related to the innovations herein, provided is the wafer tray of the first or second aspect, wherein the first flow passage and the second flow passage are connected to each other.

According to a fourth aspect related to the innovations herein, provided is a test apparatus using the wafer tray of the first or second aspect, wherein the test apparatus comprises a first exhaust apparatus connected to the first flow passage; a second exhaust apparatus connected to the second flow passage; and a control section for controlling drive of the first exhaust apparatus and drive of the second exhaust apparatus such that a vacuum degree of the first flow passage is greater than a vacuum degree of the second flow passage.

According to a fifth aspect related to the innovations herein, provided is a test apparatus using the wafer tray of any one of the first to third aspects, wherein the test apparatus comprises a probe card having a contact surface that is layered on the semiconductor wafer and on which is arranged electrical contact points, the electrical contact points connected respectively to electrical contact points of the devices under test, and the wafer tray is fixed to the test apparatus by vacuum suction achieved using a sealed space formed between the wafer tray and the probe card.

According to a sixth aspect related to the innovations herein, provided is the test apparatus of the fifth aspect, wherein the probe card is formed of at least a circuit board, which is a hard substrate, and a membrane unit having an elastic sheet on which the electrical contact points are arranged, and the sealed space is formed between the wafer tray and the circuit board via a through-hole provided in the membrane unit.

According to a seventh aspect related to the innovations herein, provided is the test apparatus of the fifth or sixth aspect, wherein the probe card can be attached to and detached from the test apparatus, and the probe card, the wafer, and the wafer tray can move integrally while maintaining the vacuum suction of the sealed space.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 26 is a partial enlarged perspective view of the probe card 300.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
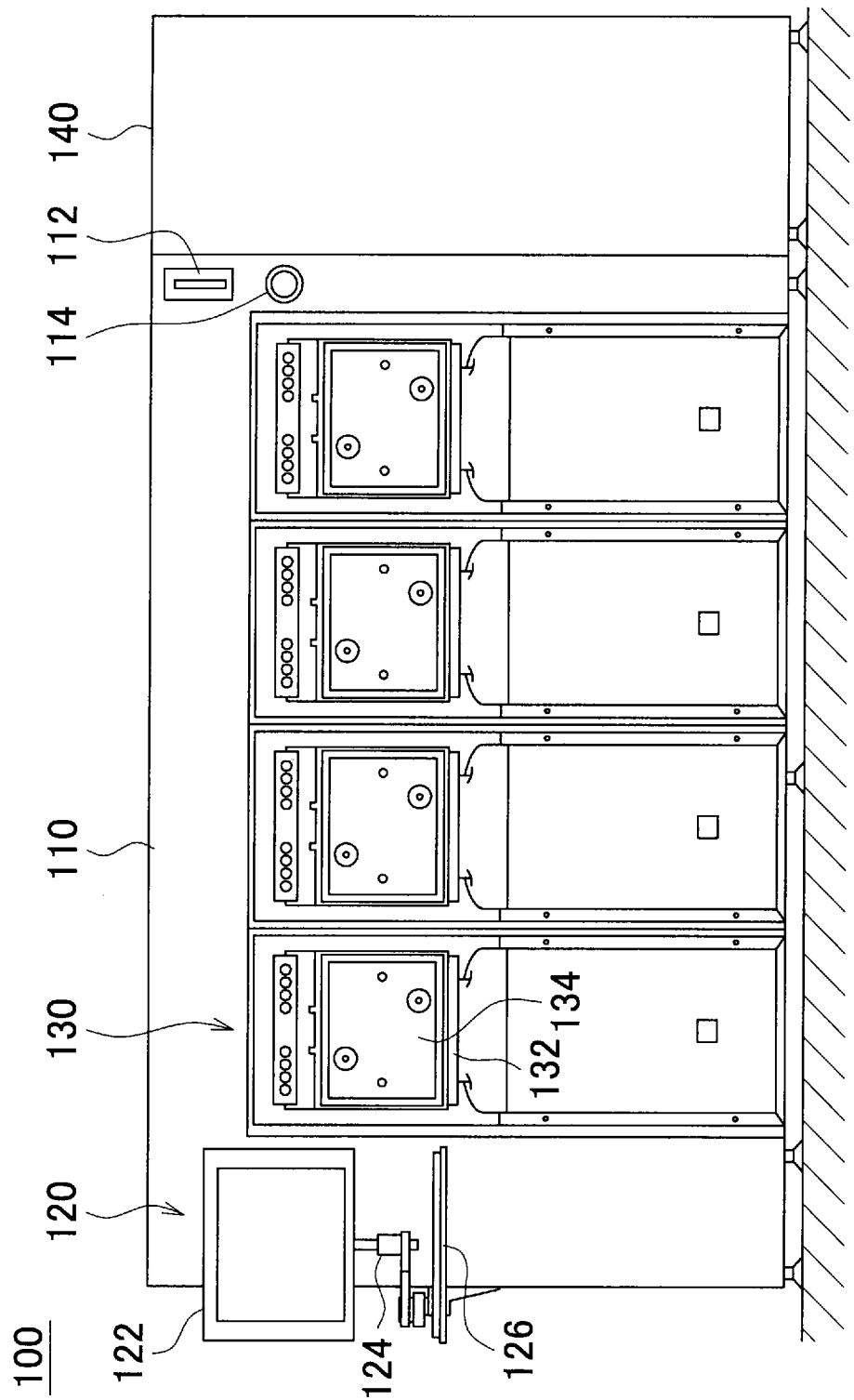
FIG. 1 is a front view of the test apparatus 100.

FIG. 1 is a front view of a test apparatus 100. The test apparatus 100 includes an EFEM 110, an operating section 120, a load unit 130, and a cooler 140.

The EFEM 110 houses a mechanism for transporting a substrate serving as a test target within the test apparatus 100. The EFEM 110 has the greatest dimensions within the test apparatus 100, and so a signal lamp 112 indicating the operational state of the test apparatus 100 and an EMO 114 that operates when the test apparatus 100 stops unexpectedly are arranged at a high position on the front surface of the EFEM 110.

The operating section 120 is supported by the EFEM 110. The operating section 120 includes a display 122, an arm 124, and an input apparatus 126. One end of the arm 124 is coupled to the EFEM 110, and the other end supports the display 122 and the input apparatus 126 in a manner to be freely movable.

The display 122 includes a liquid crystal display device or the like, and displays the operational state of the test apparatus 100 or echo back of input content from the input apparatus 126, for example. The input apparatus 126 can include a keyboard, a mouse, a tracking ball, a jog wheel, or the like, and receives settings or operations of the test apparatus 100.

Overall control of the test apparatus 100, including the operation of each component that is received from the input apparatus 126 or programmed in advance, is performed by control units that are not shown. In this case, individual control sections provided respectively to the components may perform the control, or an overall control section may issue instructions concerning the timing or the like of cooperative operations performed by the components to individual control sections.

The load unit 130 includes a load table 132 and a load gate 134. A container housing the semiconductor wafer, which serves as the test target, is placed on the load table 132. The load gate 134 opens and closes when the semiconductor wafer is transported to and from the test apparatus 100. As a result, the semiconductor wafer can be loaded from the outside without decreasing the cleanliness inside the test apparatus 100.

The cooler 140 may supply a cooled medium if the a wafer that is heated by testing in the test apparatus 100 is to be cooled prior to transportation. Therefore, the cooler 140 includes a heat exchanger and is disposed near the test head that performs the testing. The cooler 140 is used to cool a cooling medium in most cases. However, the cooler 140 can also be used to heat a heating medium in order to supply a heat source. If the source for supplying the cooled or heated medium is realized in another manner outside of the test apparatus 100, the cooler 140 may be omitted from the test apparatus 100.

Figure 2:
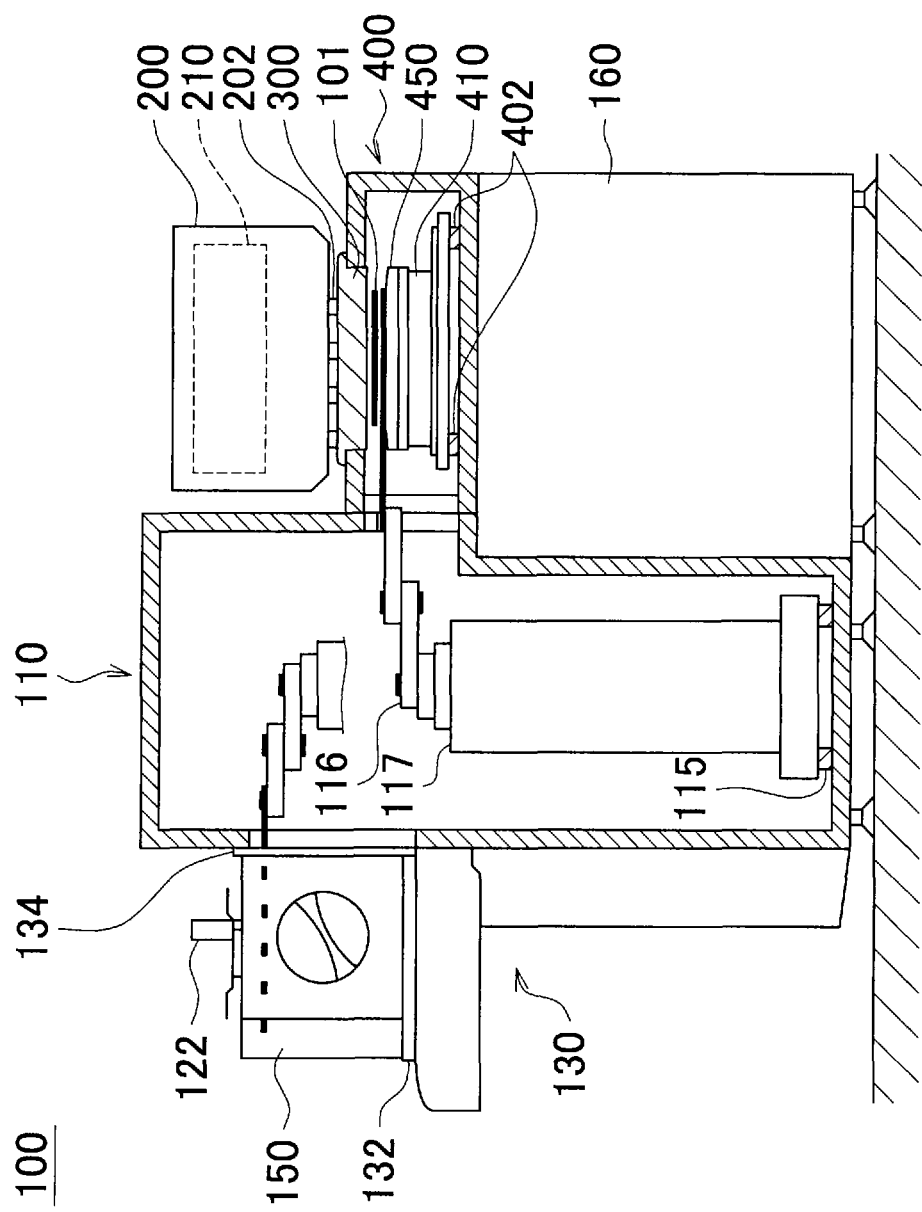
FIG. 2 shows a partial vertical cross section of the test apparatus 100.

FIG. 2 shows a partial vertical cross section of the test apparatus 100. Components that are the same as those in FIG. 1 are given the same reference numerals and redundant descriptions are omitted. The test apparatus 100 includes the load unit 130, the EFEM 110, a mainframe 160, an alignment unit 400, a probe card 300, and a test head 200. The cooler 140 is not shown in FIG. 2.

In the test apparatus 100 of the present embodiment, the load unit 130, the EFEM 110, and the mainframe 160 are arranged adjacently in the stated order from front to back, which is from the left side to the right side of FIG. 2. The alignment unit 400, the probe card 300, and the test head 200 are layered on top of the mainframe 160.

A FOUP 150 is placed on the load table 132 of the load unit 130. The FOUP 150 houses a plurality of wafers 101 serving as test targets. The FOUP 150 also stores wafers if the wafers 101 are collected after testing.

The EFEM 110 houses the robotic arm 116. The robotic arm 116 is loaded on a column 117 that runs along a rail 115, and transfers the wafers between the load unit 130 and the alignment unit 400. Therefore, the load unit 130 and the alignment unit 400 are connected to the EFEM 110 in such a manner as to be air-tight with respect to the outside, and a high level of cleanliness is maintained in each of these units.

The mainframe 160 controls the overall operation of the test apparatus 100. For example, the mainframe 160 is connected to the operating section 120, receives input from the input apparatus 126, and reflects the received input in the components of the test apparatus 100. The mainframe 160 generates display content that reflects the operational state of the test apparatus 100 and displays this content in the display 122.

Furthermore, the mainframe 160 synchronizes operation of the load unit 130, the EFEM 110, and the alignment unit 400 to pass the wafers 101 therebetween. When the EMO 114 is operated, the mainframe 160 immediately stops the operation of each section of the test apparatus 100. These operations are needed regardless of the testing content or the type of the wafer 101 being tested, and therefore the mainframe 160 is permanently attached to the test apparatus 100.

The alignment unit 400 includes an alignment stage 410. By replacing the probe card 300, the test apparatus 100 can be adapted to wafers 101 with different layouts.

The alignment stage 410 has the wafer tray 450 and the wafer 101 loaded thereon, and runs along a rail 402. The alignment stage 410 can extend and contract vertically to raise and lower a wafer 101 that is loaded thereon. As a result, after the wafer 101 is aligned with the probe card 300, the wafer 101 is pressed by the probe card 300 thereabove.

The probe card 300 may be a circuit board that is inserted between the test head 200 and the wafer 101 to provide an electrical connection therebetween when the test apparatus 100 is performing a test. When testing a wafer 101, the probe card 300 is used to form an electrical signal path between the test head 200 and the wafer 101.

The test head 200 houses a plurality of pin electronics 210. The pin electronics 210 each include an electrical circuit according to the content of a test and the test target. In other words, the test head 200 is electrically connected to the probe card 300 via a contactor 202 mounted on the bottom surface of the test head 200.

In the test apparatus 100 described above, the wafer 101 provided for testing is loaded onto the load table 132 while being stored in the FOUP 150. The robotic arm 116 takes the wafers 101 one at a time through the load gate 134, and transports the wafers 101 to the alignment unit 400.

In the alignment unit 400, the wafer 101 is loaded in a wafer tray 450 on the alignment stage 410. After aligning the loaded wafer 101 with the probe card 300, the alignment stage 410 presses the probe card 300 from below. The operations performed after this are described further below.

Figure 3:
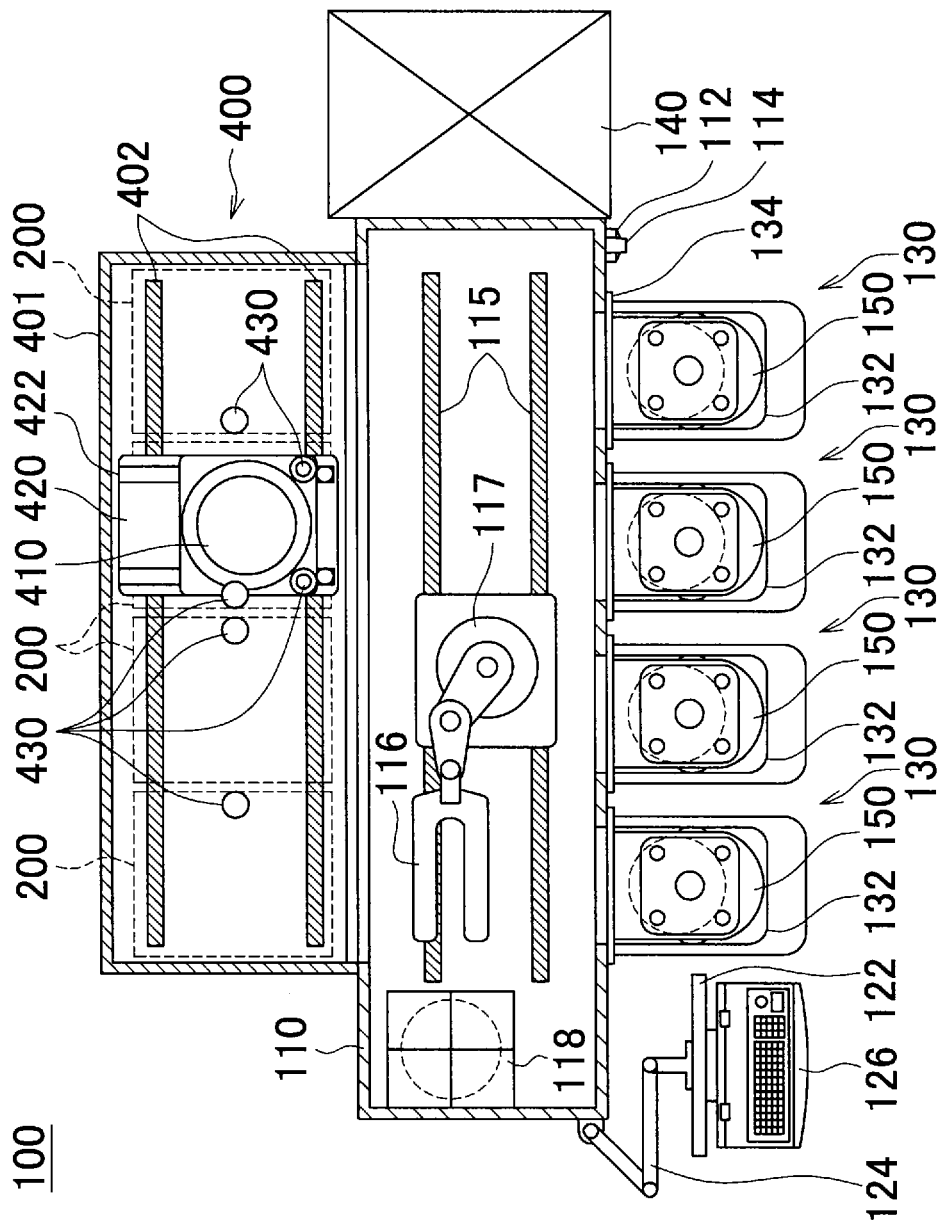
FIG. 3 shows a partial horizontal cross section of the test apparatus 100.

FIG. 3 shows a partial horizontal cross section of the test apparatus 100. Components that are the same as those in FIGS. 1 and 2 are given the same reference numerals and redundant descriptions are omitted. The test apparatus 100 includes four load units 130 and four test heads 200. Each load unit 130 has a FOUP 150 loaded thereon.

One EFEM 110 and one alignment unit 400 are provided. The alignment unit 400 includes a single alignment stage 410.

In the EFEM 110, the column 117 supporting the robotic arm 116 moves across substantially the entire width of the EFEM 110 along the rail 115. Accordingly, the robotic arm 116 can transport the wafer 101 to all of the four load units 130 and the four test heads.

A pre-aligner 118 is arranged within the EFEM 110 on an end opposite the cooler 140. The pre-aligner 118 adjusts the loading position of the wafer 101 relative to the robotic arm 116, with an accuracy that is less than that required for the test head 200 but still relatively high.

As a result, the initial positioning accuracy when the robotic arm 116 loads the wafer 101 onto the wafer tray 450 is improved, and the time necessary for alignment with the probe card 300 is decreased. Furthermore, the throughput of the test apparatus 100 is increased.

The alignment unit 400 includes rails 402 and 422, a stage carrier 420, an alignment stage 410, and microscopes 430. The rail 402 is arranged across substantially the entire width of the bottom surface of a chassis 401. The stage carrier 420 moves along the rail 402 in a longitudinal direction of the chassis 401.

The stage carrier 420 includes the rail 422 on the top surface thereof that runs parallel to the rail 402 of the chassis 401. The alignment stage 410 moves above the rail 422 in the direction of the shorter dimension of the chassis 401.

A portion of the microscopes 430 correspond to the test heads 200 and are arranged near corresponding probe cards 300. These microscopes 430 are arranged on the ceiling of the chassis 401 to face downward.

A pair of microscopes 430 are loaded on the stage carrier 420 along with the alignment stage 410. This pair of microscopes 430 moves together with the alignment stage 410. These microscopes 430 are arranged to face upward.

The wafer 101 on the alignment stage 410 can be aligned with the probe card 300 using these microscopes 430. Specifically, the position of the wafer 101 when loaded onto the alignment stage 410 can be set with a pre-alignment accuracy. The position of the wafer 101 can be accurately detected by using the downward-facing microscopes 430 to detect the edge of the wafer 101, for example.

The relative positions of the microscopes arranged on the chassis 401 with respect to the probe card 300 are already known. Therefore, the wafer 101 and the probe card 300 can be aligned by detecting the difference between the position of the wafer 101 and the position of the probe card 300 and moving the alignment stage 410 to compensate for this difference.

Detection of the position of the wafer 101 is not limited to detecting the position of the edge. For example, an image from the microscopes 430 may be displayed on the display 122, and the alignment may be performed manually.

Figure 4:
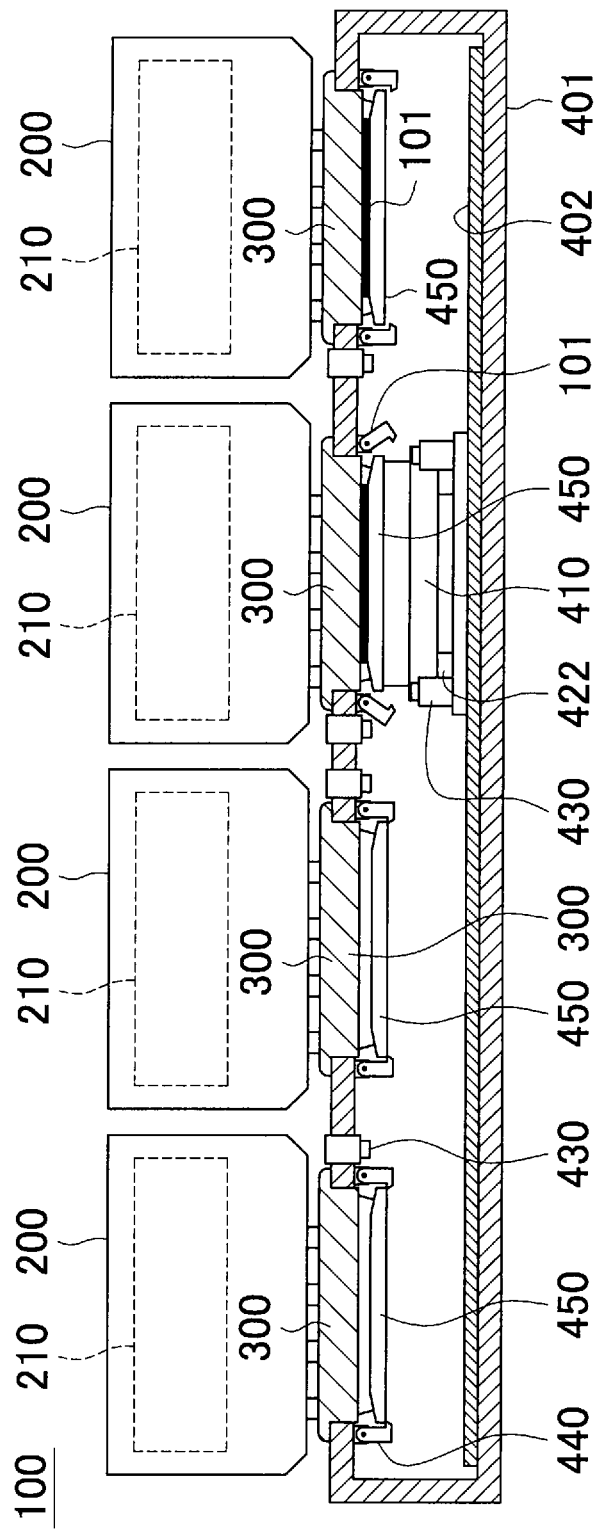
FIG. 4 shows a partial vertical cross section of the alignment unit 400.

FIG. 4 shows a partial vertical cross section of the structure of the alignment unit 400. Components that are the same as those in FIGS. 1 to 3 are given the same reference numerals and redundant descriptions are omitted. The alignment unit 400 includes the chassis 401, the alignment stage 410, and a hanger hook 440.

The chassis 401 has a width according to a plurality of test heads 200, in this case four test heads 200. Four probe cards 300 corresponding respectively to the test heads 200 are mounted on the top surface of the chassis 401. Furthermore, hanger hooks 440 that open and close are arranged on the ceiling within the chassis 401 at positions corresponding respectively to the test heads 200.

When the hanger hooks 440 are closed, the wafer trays 450 hang thereon to be held immediately below the probe cards 300. When the hanger hooks 440 open, the wafer trays 450 are released. Therefore, the alignment unit 400 can have a wafer tray 450 waiting immediately below each set of a test head 200 and a probe card 300.

The alignment stage 410 moves below the test heads 200 along the rail 402 arranged on the bottom surface in the chassis 401. The alignment stage 410 can extend and contract vertically to raise and lower a wafer tray 450 that is loaded thereon.

In the alignment unit 400 having this configuration, each wafer tray 450 held by hanger hooks 440 is loaded onto an individual alignment stage 410 that rises up from below. Next, the hanger hooks 440 open and the alignment stage 410 is released to drop, thereby releasing the wafer tray 450 from the hanger hooks 440.

Furthermore, the robotic arm 116 of the EFEM 110 loads the wafer 101 onto the wafer tray 450 whose top surface was released by the drop of the alignment stage 410. In this way, the alignment stage 410 can have the wafer 101, which is placed on the wafer tray 450, loaded thereon.

Next, the alignment stage 410 aligns the wafer 101 with the probe card 300 while raising the wafer tray 450, thereby pressing the wafer 101 against the bottom surface of the probe card 300. The probe card 300 adheres to the wafer tray 450 and the wafer 101 pressed thereto. The structure in which the probe card 300 is attached to the wafer 101 and the wafer tray 450 is described further below.

The alignment stage 410 leaves the wafer 101 and the wafer tray 450 behind and moves to transport another wafer 101. In this way, the wafer 101 can be mounted on the test head 200.

If the wafers 101 are to be collected after testing is finished, the series of operations described above are then performed in reverse. As a result, the wafer 101 can be transported by the robotic arm 116 and the wafer tray 450 waits immediately below the test head 200.

In the example of FIG. 4, in the test head 200 on the right end, the wafer tray 450 and the wafer 101 are adhered to the probe card 300 immediately below the test head 200. The hanger hooks 440 are closed, but do not contact the wafer tray 450.

Immediately below the test head 200 that is second from the right in FIG. 4, the alignment stage 410 is pushing up on the wafer tray 450 and the wafer 101 loaded thereon to attach the wafer 101 to the probe card 300. Under the other test heads 200, the hanger hooks 440 are holding the wafer trays 450 in a waiting position.

In this way, wafer trays 450 corresponding respectively to four test heads 200 are loaded in the alignment unit 400. As a result, each test head 200 can individually test a wafer 101.

The plurality of test heads 200 may perform the same type of test, or may each perform a different test. If the test heads 200 perform different tests, the throughput of the test apparatus 100 can be improved by allocating a test that requires a large amount of time to a plurality of test heads 200.

In this way, in the test apparatus 100, a single alignment stage 410 and a single robotic arm 116 can be used for a plurality of test heads 200. As a result, the usage efficiency of the alignment stage 410 and the robotic arm 116, which are unnecessary during the actual testing, can be improved.

Figure 5:
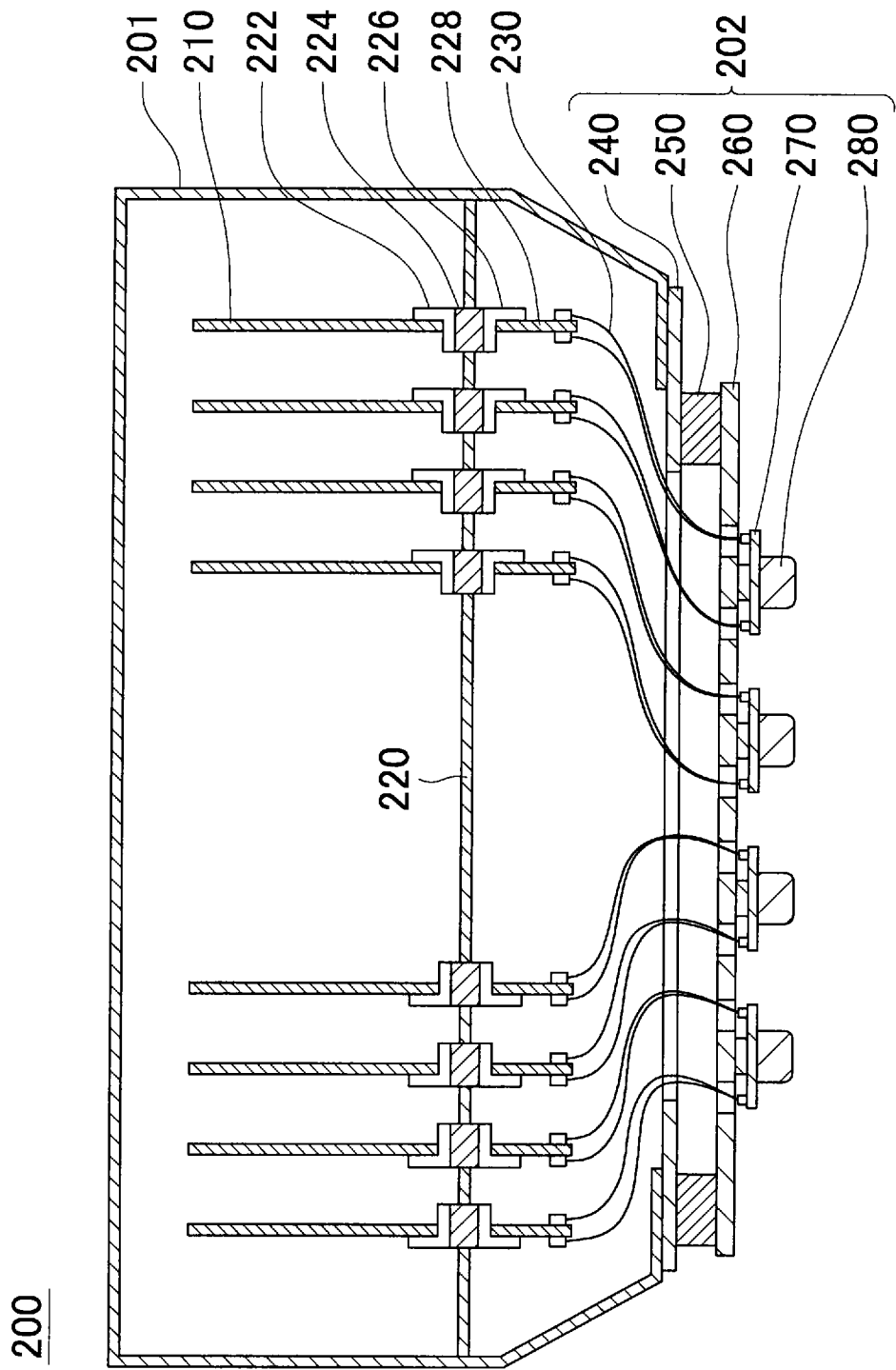
FIG. 5 is a cross-sectional view of a test head 200.

FIG. 5 is a cross-sectional view of a test head 200. Components that are the same as those in FIGS. 1 to 4 are given the same reference numerals and redundant descriptions are omitted. The test head 200 includes a chassis 201, a contactor 202, pin electronics 210, a motherboard 220, and flat cables 230.

The motherboard 220 includes a plurality of relay connectors 224 and is oriented horizontally within the chassis 201. The relay connectors 224 each include receptacles on the top surface side and the bottom surface side of the motherboard 220, and form signal paths passing through the motherboard 220.

On the top surface of the motherboard 220, the pin electronics 210 are mounted on the relay connectors 224 via angle connectors 222. With this configuration, the pin electronics 210 can be replaced according to the testing content and the specifications of the test target.

The pin electronics 210 may have the same specifications as each other or may have different specifications. Furthermore, pin electronics 210 need not be mounted on some of the relay connectors 224.

On the bottom surface of the motherboard 220, small substrates 228 are connected to the relay connectors 224 via angle connectors 226. One end of each flat cable 230 is connected to a corresponding small substrate 228. As a result, the pin electronics 210 inside the chassis 201 and the contactor 202, described further below, can be connected to each other via the flat cables 230.

The contactor 202 is mounted on the bottom surface of the chassis 201. The contactor 202 includes a support substrate 240, three-dimensional actuators 250, a contactor substrate 260, sub-substrates 270, and contactor housings 280.

The top surface of the support substrate 240 is fixed to the chassis 201, and the bottom surface of the support substrate 240 supports top ends of the three-dimensional actuators 250. The bottom ends of the three-dimensional actuators 250 support the contactor substrate 260. The sub-substrates 270 and the contactor housings 280 are fixed on the bottom surface of the contactor substrate 260.

The three-dimensional actuators 250 extend and contract vertically, and can move horizontally along the bottom surface of the support substrate 240. As a result, the contactor substrate 260 can move three-dimensionally. When the contactor substrate 260 moves, the sub-substrates 270 and the contactor housings 280 move along with the contactor substrate 260.

The bottom ends of the flat cables 230 are connected to terminals held by the contactor housings 280, such as spring pins. As a result, the pin electronics 210 are electrically connected down to the bottommost surface of the test head 200. Spring pins are given as an example of the terminals here, but configurations that use capacitance coupling or optical coupling, for example, may be adopted instead of using the spring pins.

Figure 6:
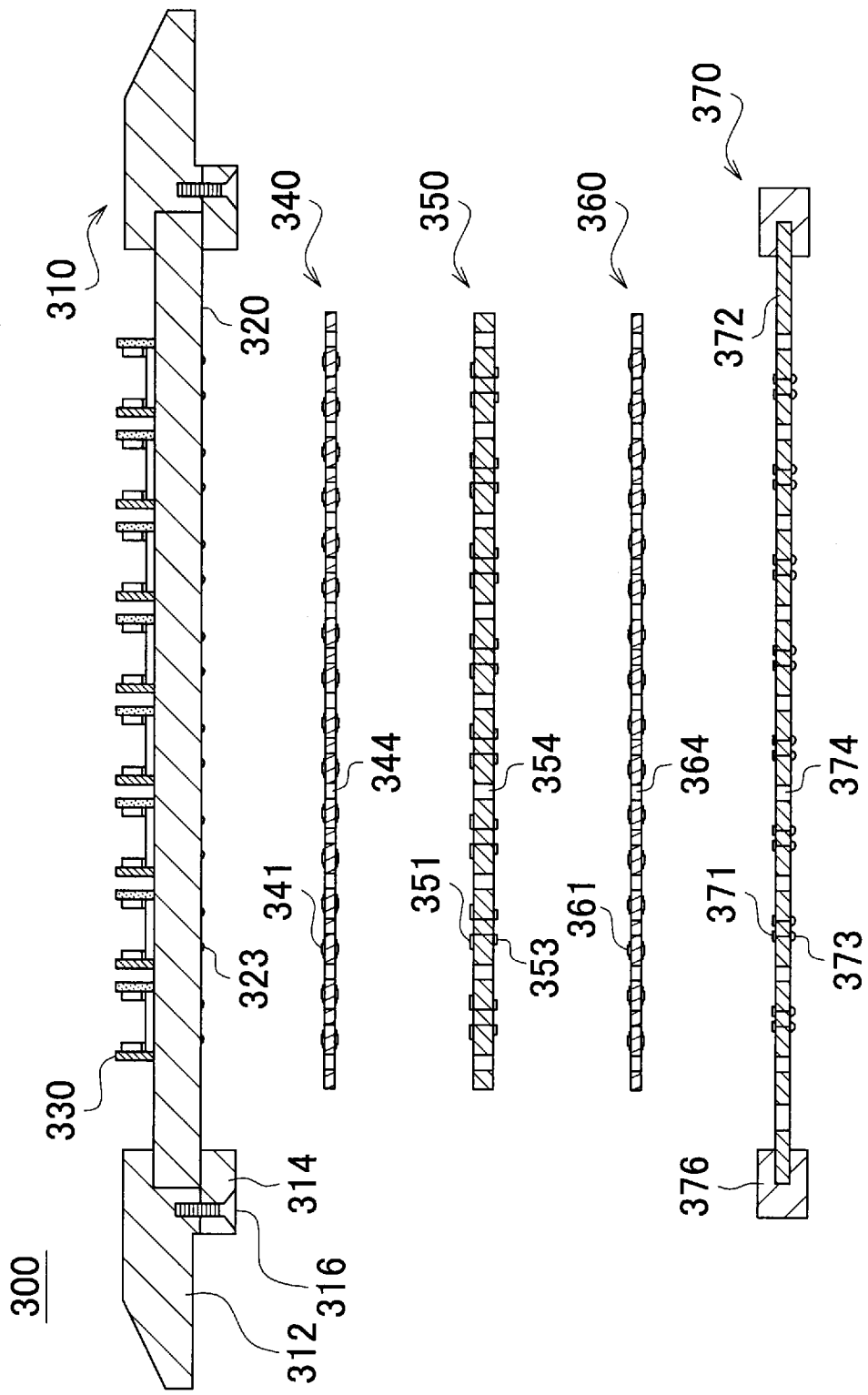
FIG. 6 is an exploded view of the probe card 300.

FIG. 6 is an exploded view of the probe card 300. The probe card 300 includes a circuit board 320, PCR sheets 340 and 360, an interposer 350, and a membrane unit 370.

The circuit board 320 may be formed by an insulating substrate with relatively high mechanical strength, such as a polyimide substrate. The circumferential edge of the circuit board 320 is sandwiched between an upper frame 312 and a lower frame 314 that are layered on each other and held together by screws 316. As a result, the mechanical strength of the circuit board 320 is further increased.

The circuit board 320 includes a plurality of guide units 330 on the top surface thereof. When the contactor 202 contacts the circuit board 320, the guide units 330 function as connector guides that guide the contactor 202 to a determined position.

Furthermore, a plurality of contact pads 323 are arranged on the bottom surface of the circuit board 320 to achieve an electrical connection via contact. The contact pads 323 are electrically connected to contact pads, not shown, that are arranged on the inner sides of the guide units 330 on the top surface of the circuit board 320.

The PCR sheet 340 includes through-electrodes 341 that pass therethrough from front to back. The through-electrodes 341 of the PCR sheet 340 have the same layout as the contact pads 323 on the bottom surface of the circuit board 320. As a result, when the circuit board 320 and the PCR sheet 340 are layered, the contact pads 323 and the through-electrodes 341 are electrically connected to each other.

The interposer 350 includes contact pads 351 and 353 respectively on the top surface and bottom surface thereof. The contact pads 351 on the top surface have the same layout as the through-electrodes 341 of the PCR sheet 340. Therefore, when the PCR sheet 340 and the interposer 350 are layered, the contact pads 351 and the through-electrodes 341 are electrically connected to each other.

The contact pads 353 on the bottom surface of the interposer 350 have a different layout than the contact pads 351 on the top surface. Therefore, on the back side of the interposer 350, the contact pads 351 and 353 have different pitches. The contact pads 353 on the bottom surface correspond respectively to the contact pads 351 on the top surface, and the corresponding contact pads 351 and 353 are electrically connected to each other.

The PCR sheet 360 includes through-electrodes 361 that pass therethrough from front to back. The through-electrodes 361 of the PCR sheet 360 have the same layout as the contact pads 353 on the bottom surface of the interposer 350. As a result, when the interposer 350 and the PCR sheet 360 are layered, the contact pads 353 and the through-electrodes 361 are electrically connected to each other.

The membrane unit 370 includes an elastic sheet 372, contact pads 371, bumps 373, and a frame 376. The elastic sheet 372 is formed by an elastic insulating material.

The contact pads 371 are arranged on the top surface of the elastic sheet 372 with the same layout as the through-electrodes 361 on the bottom surface of the PCR sheet 360. Accordingly, when the PCR sheet 340 and the membrane unit 370 are layered, the through-electrodes 361 and the contact pad 371 are electrically connected to each other.

The bumps 373 are arranged on the bottom surface of the elastic sheet 372. The frame 376 grips the circumferential edge of the elastic sheet 372 to support the elastic sheet 372 in a level state.

The PCR sheets 340 and 360, the interposer 350, and the membrane unit 370 respectively include through-holes 344, 364, 354, and 374, which pass therethrough from top to bottom. The through-holes 344, 354, 364, and 374 have substantially the same positional layouts. Therefore, when the PCR sheets 340 and 360, the interposer 350, and the membrane unit 370 are layered, the through-holes 344, 354, 364, and 374 are connected to facilitate exhaust between the components.

Figure 7:
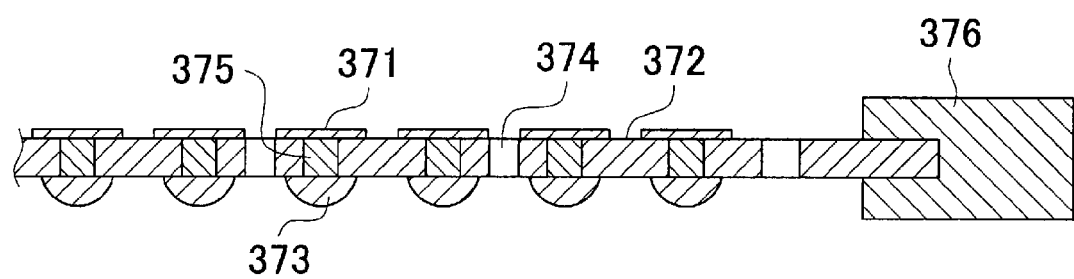
FIG. 7 shows a partial enlarged cross section of the membrane unit 370.

FIG. 7 shows a partial enlarged cross section of the membrane unit 370. In the membrane unit 370, the bumps 373 are arranged with the same layout as the test pads of the circuit on the wafer 101 being tested. When a device on the wafer 101 is being tested, the test pads form electrical contact points that are used for supplying power or inputting a signal to this device under test.

The bumps 373 form sets that each include a plurality of bumps corresponding to individual circuits on the wafer 101, and the number of sets formed is equal to the number of circuits on the wafer 101. Each bump 373 faces downward and has a protruding central region. As a result, the bumps 373 function as connection terminals for connecting the wafer 101 to the bottommost surface of the probe card 300.

Each bump 373 is electrically connected to one of the contact pads 371 via a through-hole 375 formed in the elastic sheet 372. As described above, the contact pads 371 have the same layout as the through-electrodes 361 of the PCR sheet 360 and the contact pads 353 on the bottom surface of the interposer 350. Accordingly, when the membrane unit 370, the PCR sheet 360, and the interposer 350 are layered, an electrical connection is formed from the bumps 373 to the interposer 350.

Figure 8:
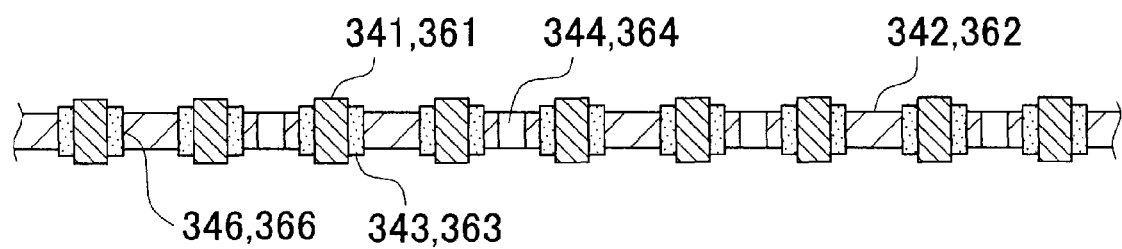
FIG. 8 shows a partial enlarged cross section of the PCR sheets 340 and 360.

FIG. 8 shows a partial enlarged cross section of the PCR sheets 340 and 360. The PCR sheets 340 and 360 include through-electrodes 341 and 361, frames 342 and 362, and elastic support members 343 and 363.

The frames 342 and 362 are formed of a material with relatively high rigidity, such as metal, and include a plurality of through-holes 346 and 366 that have inner circumferences larger than the outer circumferences of the through-electrodes 341 and 361. The through-electrodes 341 and 361 are each supported from the frame 362 via the elastic supports 343 and 363 on the inside of the through-holes 346 and 366 formed in the frames 342 and 362.

The elastic supports 343 and 363 are formed of a soft material such as silicon rubber. The through-electrodes 341 and 361 each have a length greater than the width of the frame 362. As a result, when the PCR sheets 340 and 360 are sandwiched between the interposer 350 and the circuit board 320 or between the interposer 350 and the membrane unit 370, the unevenness of each component is compensated for to achieve favorable electrical coupling.

Figure 9:
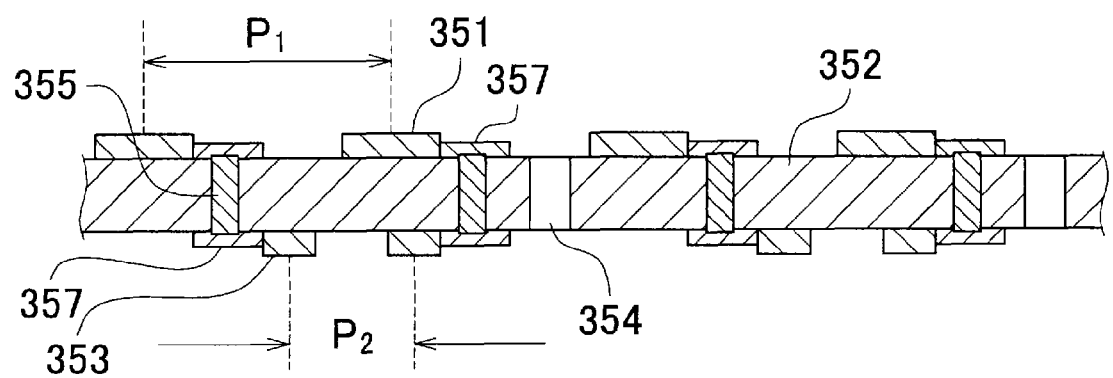
FIG. 9 shows a partial cross section of the interposer 350.

FIG. 9 shows a partial cross section of the interposer 350. The substrate 352 of the interposer 350 includes a plurality of through-holes 355 that pass therethrough from front to back. The through-holes 355 are connected to the contact pads 351 and 353 via the wiring layer 357. As a result, the contact pads 351 and 353 on the front and back of the substrate 352 are electrically connected to each other.

Furthermore, since the wiring layers 357 are interposed between (i) the through-hole 355 and (ii) each of the contact pads 351 and 353, the contact pads 351 on the top surface and the contact pads 353 on the bottom surface can have different layouts. Accordingly, even when the contact pads 353 on the bottom surface of the interposer 350 match the test pads of the wafer 101 being tested, the contact pads 351 on the top surface of the interposer 350 can have any layout.

More specifically, the test pads of the wafer 101 are formed on an integrated circuit, and so the test pads have a small testing surface area and the pitch between the pads is also small. Furthermore, by matching the test pads with a pitch P2 of the contact pads 353 on the bottom surface of the interposer 350 while forming the contact pads 351 on the top surface of the interposer 350 with a larger pitch P1, the through-electrodes 341 and contact pads 323 in the PCR sheet 340 and the circuit board 320 layered on the interposer 350 can have a larger pitch.

By setting the surface area of the contact pads 351 on the top surface of the interposer 350 to be greater than the surface area of the contact pads 353 on the bottom surface, the need for accurate positioning of the interposer 350, the PCR sheet 340, and the circuit board 320 can be satisfied. Furthermore, the electrical characteristics caused by contact resistance or the like can be improved.

In this way, the pitch of the contact pads 351 arranged on the top surface of the probe card 300 can be larger than that of the bump 373 of the membrane unit 370. Furthermore, the surface area of the contact pads 321 can be made larger than that of the bumps 373. As a result, the connection between the contactor 202 and the probe card 300 is simpler and more reliable.

Figure 10:
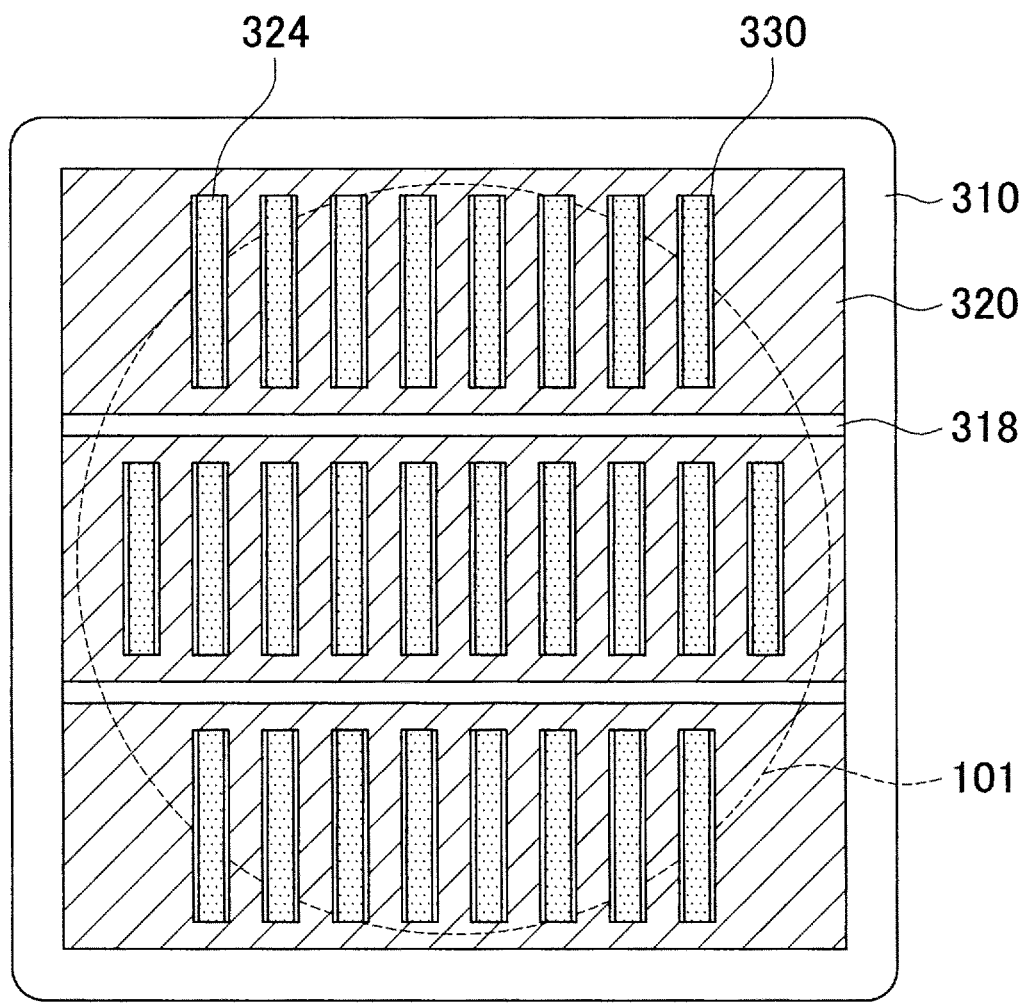
FIG. 10 is a planar view of the circuit board 320.

FIG. 10 is a planar view of the circuit board 320. The circuit board 320 has a square planar surface that is slightly larger than the square contacting the outer edge of the wafer 101 shown by the dotted line. The stiffener 310 surrounds the outer edge of the circuit board 320. The stiffener 310 includes crossing members 318 that cut across the circuit board 320.

The crossing members 318 are mounted firmly to the frame-shaped stiffener 310. As a result, the bending rigidity of the overall circuit board 320 and the stiffener 310 formed integrally therewith can be improved, as can the torsional rigidity. Accordingly, deformation such as twisting of the circuit board 320 can be prevented.

A plurality of guide units 330 are arranged in parallel on the surface of the circuit board 320 between the stiffener 310 and the crossing members 318. A plurality of contact pads on the top surface of the circuit board 320 are gathered to form pad groups 324 within the guide units 330. In this way, the contact pads 321 of the probe card 300 may be formed as n sets of pad groups 324 that each include the same signal configuration.

The pad groups 324 each have the same arrangement. Each contact pad forming a pad group 324 is electrically connected to one of the contact pads 321 on the bottom surface of the circuit board 320, but in each pad group 324, individual contact pads share the same signal configuration.

In this way, a pad group 324 being tested by one connection with the contactor 202 may have a configuration corresponding to a test pad having the same signal configuration in the wafer 101. As a result, the pad groups 324 can be electrically connected using contactors 202 with the same specifications. Furthermore, one contactor 202 can be moved to form electrical connections with a plurality of pad groups 324.

The circuit board 320 also includes contact pads in a region overlapping the wafer 101, and occupies an area close to that of the wafer 101. Accordingly, the probe card 300 including the circuit board 320 can be miniaturized to conserve space within the test apparatus 100.

Figure 11:
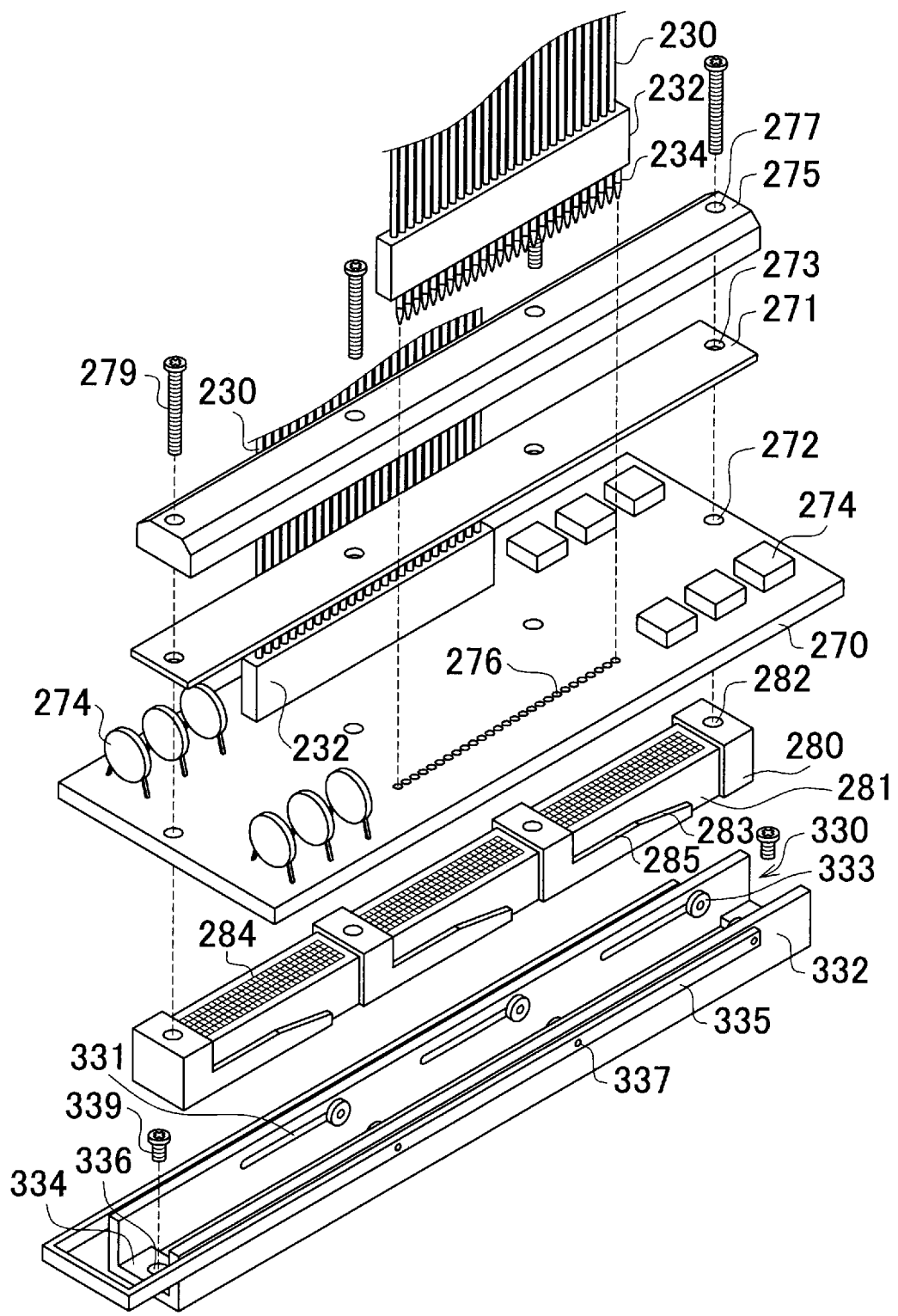
FIG. 11 is a partial perspective view of a contactor 202.

FIG. 11 is a partial perspective view of a contactor 202. The contactor 202 includes a sub-substrate 270 and a contactor housing 280. The sub-substrate 270 has a length that is substantially equal to the longitudinal dimension of the contactor housing 280 and a width that is greater than that of the contactor housing 280.

The sub-substrate 270 includes receptacles 276 and screw holes 272 that pass therethrough in the direction of the thickness of the sub-substrate 270. The screw holes 272 have the same arrangement as the screw holes 282 of the contactor housing 280, described further below, and have inner diameters that allow screws 279 to be inserted therethrough.

The receptacles 276 are formed to be complementary to contact pins 234 that protrude downward from the connector housing 232. The connector housing 232 is provided on the bottom end of the flat cable 230, and each contact pin 234 is electrically connected to a wire of the flat cable 230.

The receptacles 276 are connected to wiring, not shown, of the sub-substrate 270. As a result, when the contact pins 234 are inserted into the receptacles 276, an electrical connection is formed between the flat cable 230 and the wiring of the sub-substrate 270.

An insulation sheet 271, a reinforcing member 275, and mounted components 274 are arranged on the top surface of the sub-substrate 270. The insulation sheet 271 and the reinforcing member 275 each occupy substantially the same surface area as the contactor housing 280. The insulation sheet 271 and the reinforcing member 275 respectively include screw holes 273 and 277 that pass through the insulation sheet 271 and the reinforcing member 275 in the thickness directions thereof and that have the same arrangement as the screw holes 272 of the sub-substrate 270.

The insulation sheet 271 is formed of a dielectric material and is interposed between the sub-substrate 270 and the reinforcing member 275. As a result, even when circuits are formed on the top surface of the sub-substrate 270, a conductive metal or the like can be used as the reinforcing member 275.

The mounted components 274 may be electronic elements such as bypass capacitors, for example. By forming this type of element on the sub-substrate 270, noise can be restricted near the wafer 101.

The contactor housing 280 includes a plurality of housing holes 284 that are open on the top surface, and inclined portions 283 and flat portions 285 that are formed on the sides. The housing holes 284 pass through the contactor housing 280 in the height direction. The flat portions 285 and the inclined portions 283 are arranged in the center of the height of the contactor housing 280, and longitudinal portions thereof form passing portions 281 that are not stepped.

The reinforcing member 275 and the insulation sheet 271 are fastened to the contactor housing 280 using screws 279, with the sub-substrate 270 sandwiched therebetween. As a result, the sub-substrate 270, the insulation sheet 271, and the reinforcing member 275 are formed integrally to exhibit high mechanical strength.

The guide unit 330 includes a channel member 332, rollers 333, an operation bar 335, and spindles 337. The channel member 332 is formed by a pair of horizontal joining portions 334 joined to a pair of vertical walls at the ends thereof. Each joining portion 334 has a screw hole 336 in the center thereof.

Elongated holes 331 are formed through the vertical walls of the channel member 332 and extend in the longitudinal direction of the channel member 332. The rollers 333 are arranged on the inside of the channel member 332 and are each supported by an end of a spindle 337 inserted through an elongated hole 331. The other end of each spindle 337 is connected to the operation bar 335.

As a result, when the operation bar 335 moves in the longitudinal direction of the channel member 332, the rollers 333 also move together. The guide unit 330 is mounted on the top surface of the circuit board 320 using screws 339 inserted through the screw holes 336.

Figure 12:
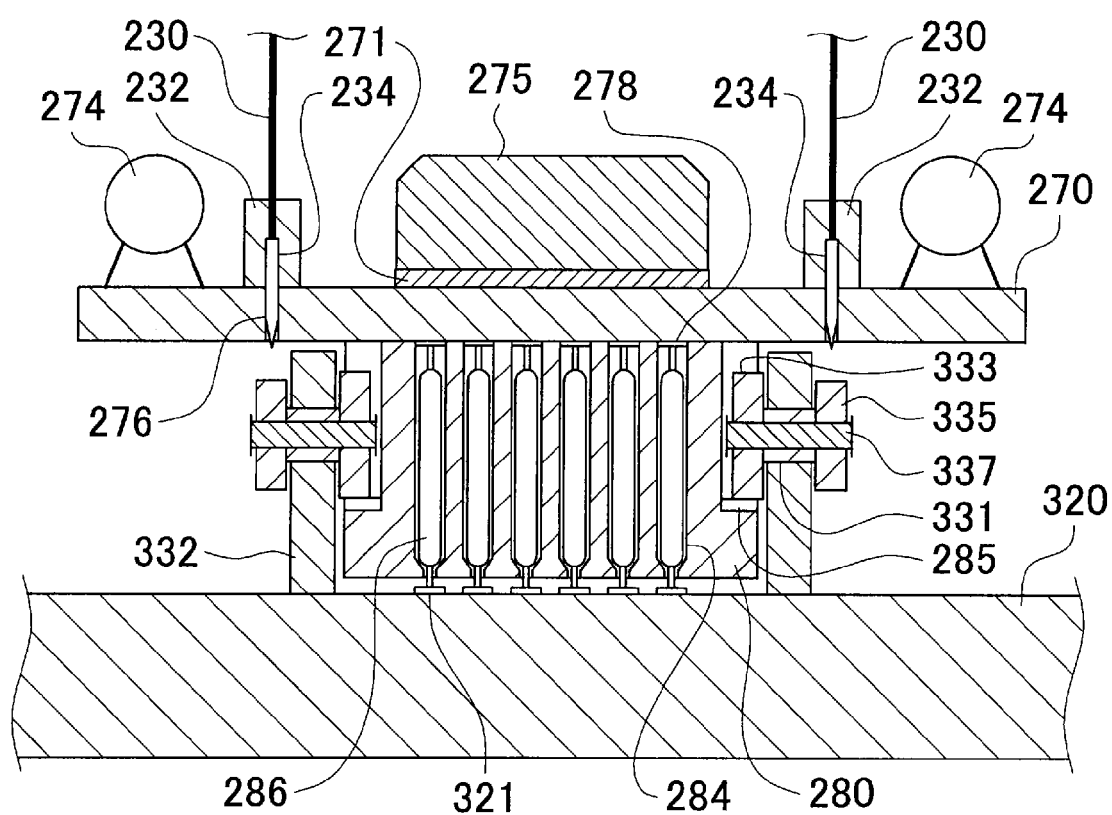
FIG. 12 is an enlarged cross-sectional view of a contactor 202.

FIG. 12 is an enlarged cross-sectional view of a contactor 202. Components that are the same as those in other Figures are given the same reference numerals and redundant descriptions are omitted.

The contactor housing 280 houses a spring pin 286 in each housing hole 284 to form an exemplary connector. The spring pins 286 are biased at both ends in the expansion/contraction direction. Accordingly, when the contactor housing 280 is attached to the sub-substrate 270, the spring pins 286 are pressed by the contact pads 278 on the bottom surface of the sub-substrate 270 to be electrically connected to the wiring of the sub-substrate 270.

When the test apparatus 100 is performing testing, the contactor housing 280 enters into the guide unit 330. The intervals between rollers 333, in the guide unit 330 are substantially equal to the width of the contactor housing 280, in the regions above the stepped portions. Accordingly, the rollers 333 are moved along the stepped portions by moving the operation bars 335 after the rollers 333 have passed beyond the passing portions 281 and reached the tops of the stepped portions.

The rollers 333 that have passed from the passing portions 281 and up the inclined portions 283 arrive on top of the flat portions 285. At this point, the contactor housing 280 is pressed down toward the circuit board 320. As a result, the bottom end of each spring pin 286 is pressed by a contact pad 321 on the top surface of the circuit board 320. In this way, a signal path is formed from the probe card 300 including the circuit board 320 to the test head 200, via the contactor 202 and the flat cable 230.

Each contactor housing 280 is pulled individually by a guide unit 330 to be pressed to the circuit board 320. Accordingly, a reliable electrical connection can be achieved even if strong pressure is not exerted on the overall contactor 202. Furthermore, since each contactor housing 280 is independently pulled by a guide unit 330, electrical connection can be achieved without applying strong pressure to the probe card 300.

Since the pressing of the contactor housings 280 is achieved using the guide units 330, the test head 200 need not generate a strong pressing force to for pressing the overall contactor 202 to the probe card 300. Accordingly, the three-dimensional actuator 250 only needs to achieve a drive force for aligning the contactor 202, allowing a small and low-cost configuration to be selected.

Figure 13:
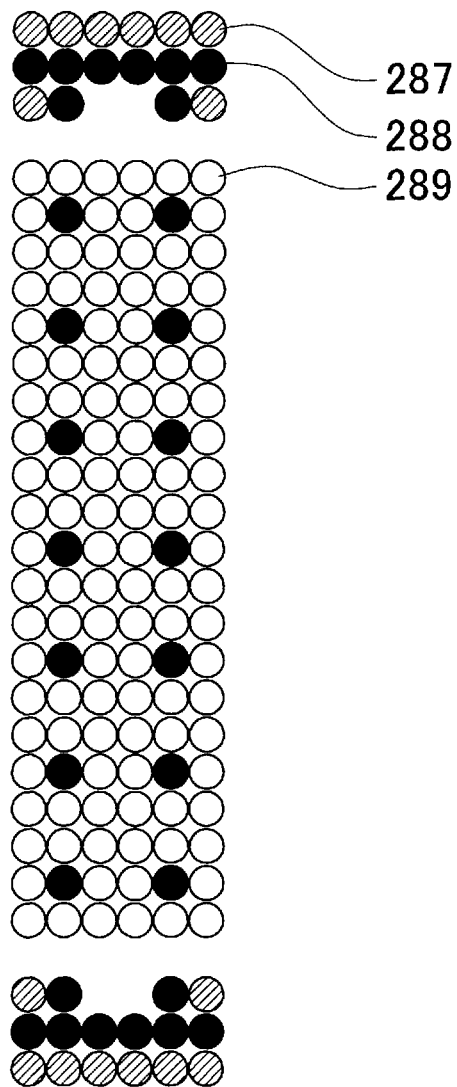
FIG. 13 shows a signal configuration in the contactor housing 280.

FIG. 13 shows a signal configuration of spring pins 286 in the contactor housing 280. Housing holes 284 are provided on the contactor housing 280 to form three groups. By setting the signal configuration of the spring pins 286 inserted into each group to be the same, the pad groups 324 can be electrically connected using contactors 202 with the same specifications. Furthermore, a single contactor 202 can be moved to form electrical connections with a plurality of pad groups 324.

In the example of FIG. 13, the power supply line 287 is allocated to the spring pins 286 positioned at the ends of the contactor housing 280, the signal line 289 is allocated to the spring pins 286 in the middle of the contactor housing 280, and the ground line 288 is arranged therebetween. With this configuration, the power supply line 287 can be shared to decrease the number of spring pins 286. Furthermore, noise is prevented from jumping from the power supply line 287 to the signal line 289.

Figure 14:
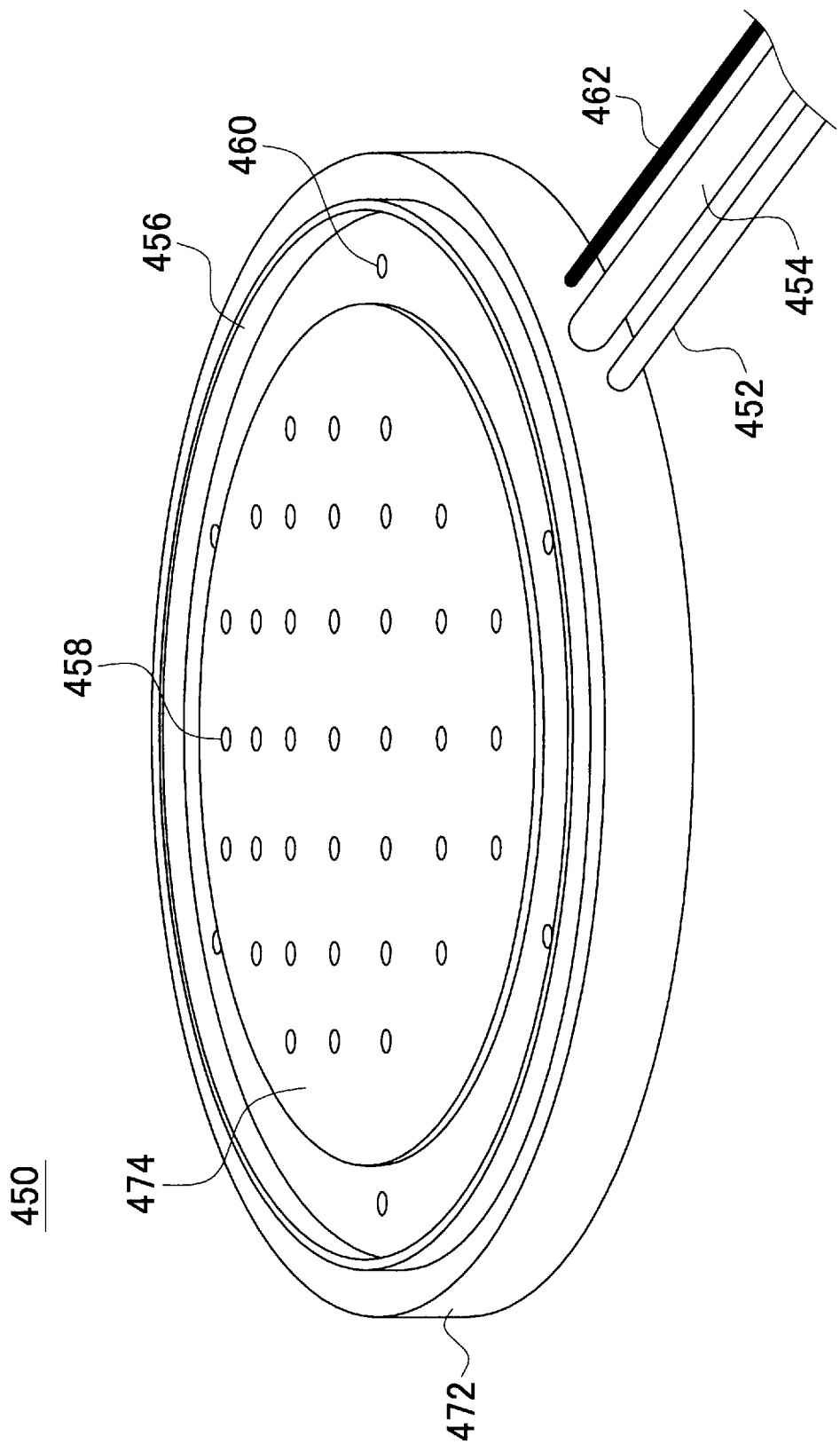
FIG. 14 is a perspective view of the top surface of the wafer tray 450.

FIG. 14 is a perspective view of the top surface of the wafer tray 450. Components that are the same as those in other Figures are given the same reference numerals and redundant descriptions are omitted.

The base 472 includes a loading surface 474 of the wafer 101 on a central region of the top surface thereof. The loading surface 474 includes a plurality of openings 458. The openings 458 are the ends of a flow passage 452 that branches within the base 472 appearing on the loading surface 474. The outer circumference of the loading surface 474 has a plurality of openings 460. The openings 460 are the ends of a flow passage 454 that branches within the base 472 appearing on the outer circumference of the loading surface 474. Wiring 462 for electrically connecting to the inside of the base 472 extends outside the base 472.

The wafer tray 450 includes a diaphragm 456 on the top surface of the base 472 on the outer side of the openings 460.

The diaphragm 456 is formed of an elastic material such as rubber, and deforms when the alignment stage 410 is raised to press against the probe card 300, thereby forming a sealed space between itself and the probe card 300.

The connections of the flow passage 452 and 454 and the wiring 462 with the inside of the base 472 is achieved by, for example, using a joint mechanism to connect the flow passage 452 and 454 inside the base 472 to the flow passage 452 and 454 outside the base 472 at the border therebetween and, in a similar manner, using a connector mechanism to connect the wiring 462 inside and outside the base 472 at the border therebetween. In this case, the flow passages 452 and 454 outside the base 472 can be formed as flexible tubes and the wiring 462 can be formed as flexible cables. With this configuration, the wafer tray 450 can be loaded on the alignment stage 410 and moved by the stage carrier 420 below an adjacent test head 200. In other words, the wafer trays 450 provided respectively for the test heads 200 can be exchanged with each other. When the wafer trays 450 are exchanged with each other, the exchanged wafer tray 450 is withdrawn by the robotic arm 116.

Figure 15:
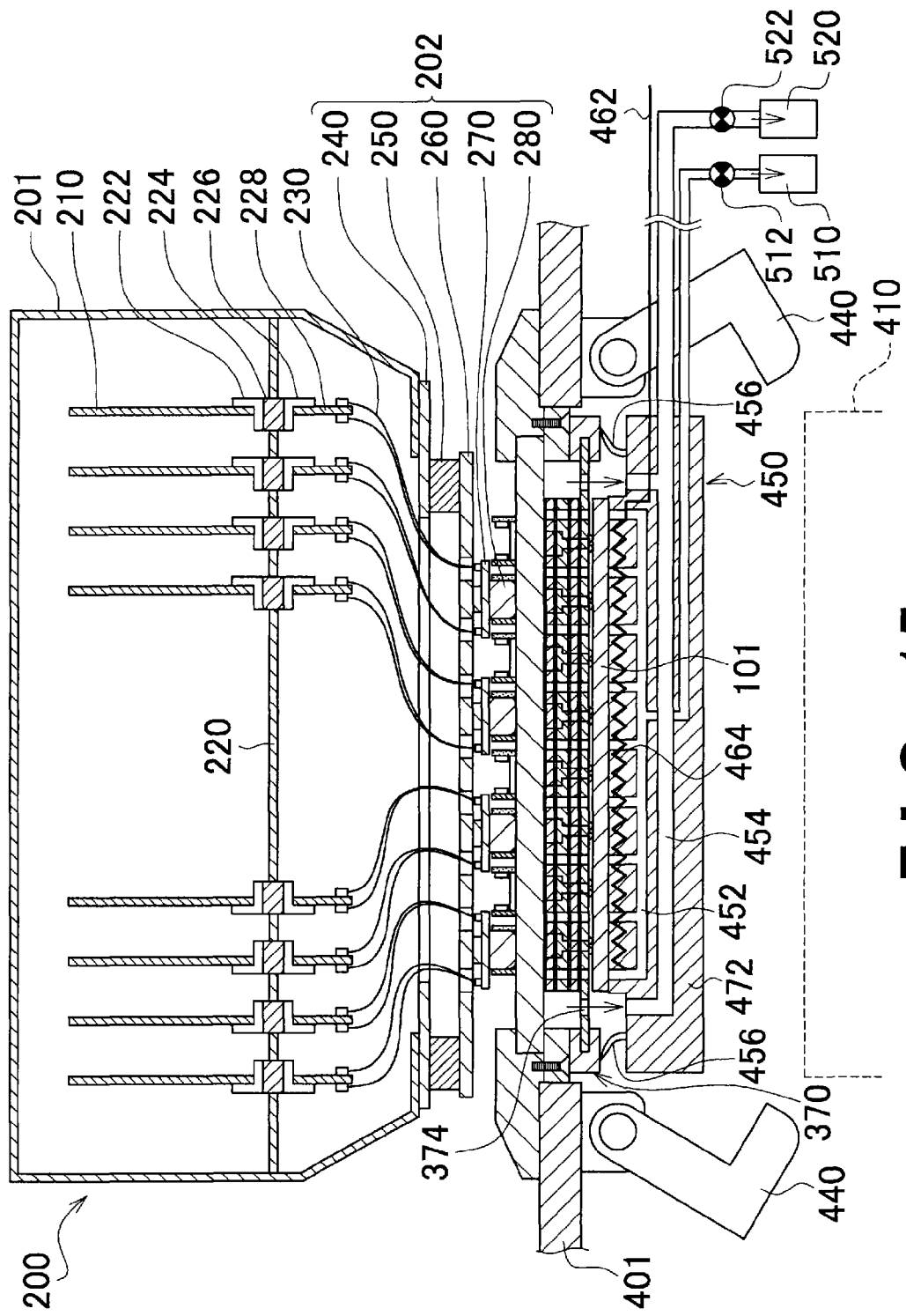
FIG. 15 is a cross-sectional view of a test head 200 and a probe card 300.

FIG. 15 is a cross-sectional view of a test head 200 and a probe card 300. Components that are the same as those in other Figures are given the same reference numerals and redundant descriptions are omitted.

The end of the flow passage 452 opposite the openings 458 is connected to a depressurizing source 510, which is an exhaust apparatus, via a valve 512. As a result, when the valve 512 is connected while the wafer 101 is in the loaded state, the wafer tray 450 holds the wafer 101 by exerting suction thereon.

The end of the flow passage 454 opposite the openings 460 is connected to a depressurizing source 520, which is an exhaust apparatus, via a valve 522. As a result, when the valve 522 is connected while the wafer 101 is in the loaded state, the wafer tray 450 exerts suction on the bottom surface of the probe card 300 and presses the thusly held wafer 101 against the probe card 300. In other words, when the probe card 300 is fixed to the chassis 401, the wafer tray 450 is fixed to the test apparatus 100 by the vacuum suction. Here, the control section of the test apparatus 100 controls the drive of the depressurizing sources 510 and 520 such that the suction strength of the flow passage 452 is greater than that of the flow passage 454. With this type of control, the wafer 101 is prevented from rising off the loading surface 474 when the suction is exerted on the wafer 101, even during processes in which the wafer tray 450 is pushed against the probe card 300.

Furthermore, through-holes 374 are formed in the elastic sheet 372 of the membrane unit 370 positioned on the bottommost surface of the probe card 300. Accordingly, when the pressure is reduced in the sealed space between the probe card 300 and the wafer tray 450, the pressure within the probe card 300 is also reduced. As a result, the circuit board 320, the PCR sheets 340 and 360, the interposer 350, and the membrane unit 370 of the probe card 300 are pressed against each other to reliably form a signal path from the wafer 101 to the test head 200.

Heaters 464 are provided in the base 472 of the wafer tray 450. The heaters 464 are connected to the wiring 462 and are controlled by the control section of the test apparatus 100 to manage the temperature of the loading surface 474. With this configuration, the loading surface 474 is heated by the heaters 464, and so when thermal testing is performed by the test head 200, the wafer 101 can be quickly brought to the desired temperature.

In the manner described above, a test apparatus 100 is formed that tests a plurality of devices formed on a wafer 101. This test apparatus 100 includes (i) a probe card 300 having a top surface on which a plurality of contact pads 321 are formed that are connected respectively to corresponding test pads on a bottom surface of the probe card 300, which is stacked on the wafer 101, and (ii) a contactor 202 that sequentially connects to portions of the plurality of contact pads 321 of the probe card 300.

Figure 16:
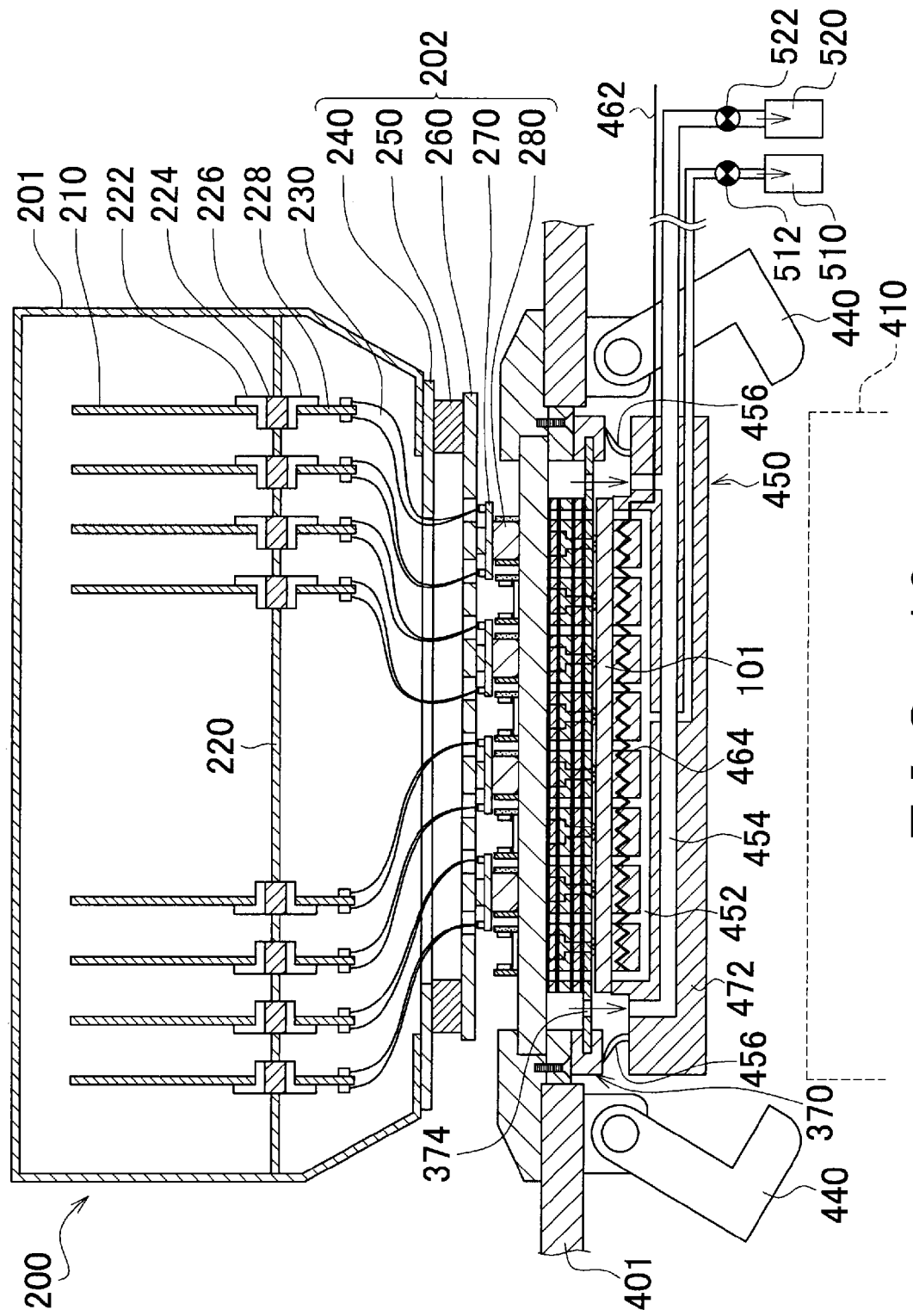
FIG. 16 is a cross-sectional view of a test head 200 and a probe card 300.

FIG. 16 is a cross-sectional view of a test head 200 and a probe card 300. FIG. 16 is the same as FIG. 15, except that the contactor substrate 260 of the contactor 202 and the contactor housing 280 move to engage with a different guide unit 330. Therefore, components that are the same as those in FIG. 15 are given the same reference numerals and redundant descriptions are omitted.

By moving the operation bar 335 of the guide unit 330 such that the rollers 333 move to the positions of the passing portions 281, the contactor housing 280 can be lifted from the guide unit 330. In this state, by moving the three-dimensional actuator 250 in the contactor 202, the contactor substrate 260, the sub-substrate 270, and the contactor housing 280 are lifted up, thereby removing the contactor housing 280 from the guide unit 330.

By moving the three-dimensional actuator 250, the contactor substrate 260, the sub-substrate 270, and the contactor housing 280 move horizontally, e.g. toward the right side of FIG. 16, and can be lowered at another position to insert the contactor housing 280 into a guide unit 330 that was empty in the state shown in FIG. 15. Within other guide units 330 as well, the mechanism for lifting using the rollers 333 and the signal configuration for the contact pads 321 are shared, and therefore the same test head 200 can be used to perform the same test using another guide unit 330.

Figure 17:
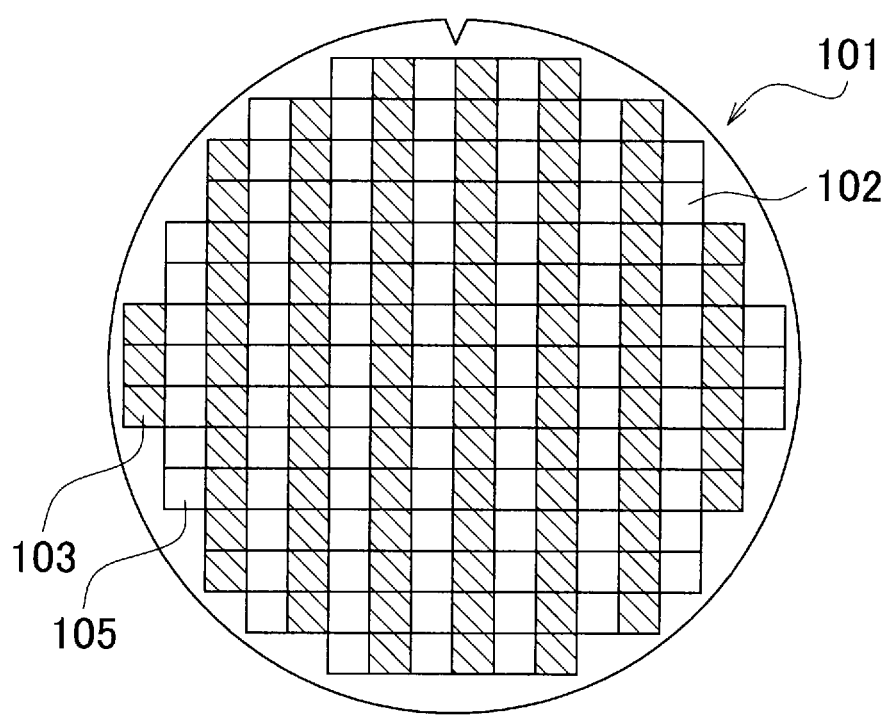
FIG. 17 is a planar view of the test region 103.

FIG. 17 is a planar view of a region of a wafer 101 on which testing is performed. When the contactor 202 and the probe card 300 are connected as shown in FIG. 15, the element regions 102 of every other row beginning from the left end, for example, from among the plurality of element regions 102 of the wafer 101, form the test region 103 to be tested, as shown by the diagonal-line pattern in FIG. 17.

The other element regions 102 correspond to guide units 330 to which the contactor 202 is not connected, and therefore form a non-test region 105 that is not tested.

Figure 18:
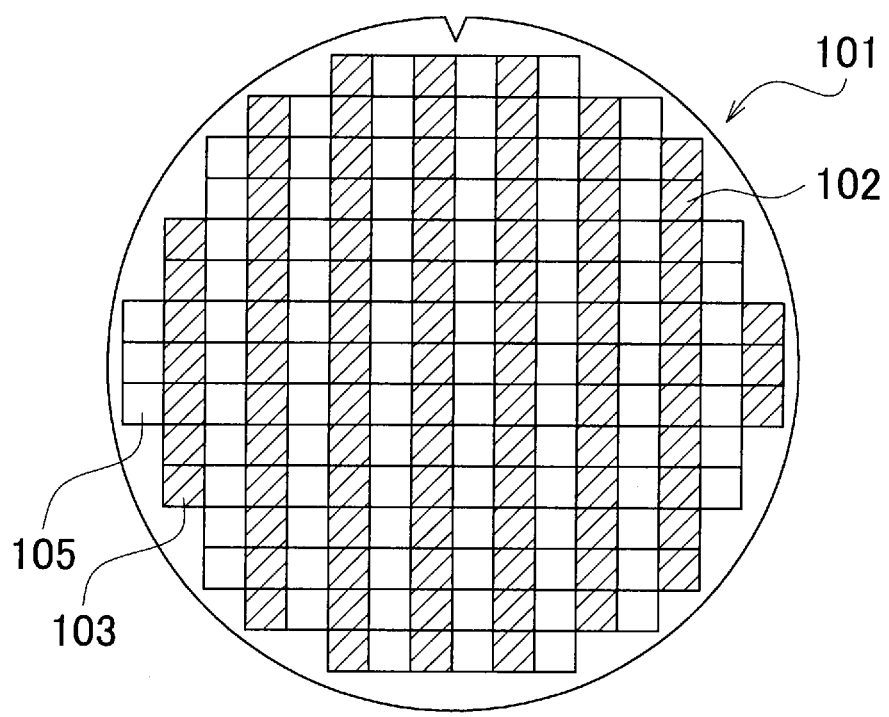
FIG. 18 is a planar view of the test region 103.

FIG. 18 is a planar view of a region of a wafer 101 on which testing is performed. FIG. 18 shows a case in which the contactor 202 is moved such that the contactor 202 and the probe card 300 are connected as shown in FIG. 16.

In this case, the element regions 102 in the test region 103 of FIG. 17 are now in the non-test region 105. Furthermore, the region that was the non-test region 105 in FIG. 17 is now the test region 103.

In this way, the pad groups 324 on the probe card 300 may be sequentially connected to adjacent element regions 102 on the wafer 101. As a result, by moving the contactor 202, the entire wafer 101 can be tested in two stages. In other words, the dimensions of the test head 200 can be decreased by half compared to a case in which the entire wafer 101 is tested at once.

Furthermore, the contactor 202 contacts and separates from the top surface of the probe card 300, which has an expanded surface area and contact pad 321 pitch, and this allows for more leeway in the alignment accuracy of the contactor 202 than when the contactor 202 directly contacts the wafer 101. As a result, the contactor 202 can be raised, lowered, and moved quickly, thereby improving the throughput of the test apparatus 100.

The number of times partial testing is performed to test the entire wafer 101 is not limited to two, and the entire wafer 101 can be tested using n partial tests by sequentially connecting a contactor 202 that includes a plurality of spring pins 286 corresponding to n sets of element regions 102 on the arranged on the wafer 101. When testing of a single wafer 101 is divided into n partial tests, the pressing force that the contactor 202 exerts on the probe card 300 is 1/n, and this allows more freedom with respect to the drive force source and the strength of the test apparatus 100. Furthermore, there is more freedom with respect to the strength of the probe card 300, and testing can be performed without placing a significant burden on the wafer 101, such as bending.

Furthermore, a reliable electrical connection can be achieved between the contactor 202 and the probe card 300 by pressing the contactor 202 with only a small pressing force.

The arrangement of the test region 103 and the non-test region 105 is not limited to the arrangements shown in FIGS. 17 and 18. For example, the test region 103 may be in a plaid pattern, such that heating of the element region 102 due to testing can be evenly distributed in the wafer 101.

By including a plurality of contactors 202 corresponding to a portion of the element regions 102 on the wafer 101 and sequentially connecting the contactors 202 to the wafer 101 via the probe card 300 in this way, the testing can be performed as any number of partial tests. As a result, the number of electrical contact points and pin electronics, which incur a high cost, are decreased, thereby making the test apparatus 100 smaller and less expensive.

In the above embodiment, the contactor 202 is moved relative to a fixed probe card 300 and is connected to different pad groups 324. However, the configuration of the test apparatus 100 is not limited to this, and instead the contactor 202 can be fixed while the probe card 300, the wafer 101, and the wafer tray 450 are moved integrally.

Figure 19:
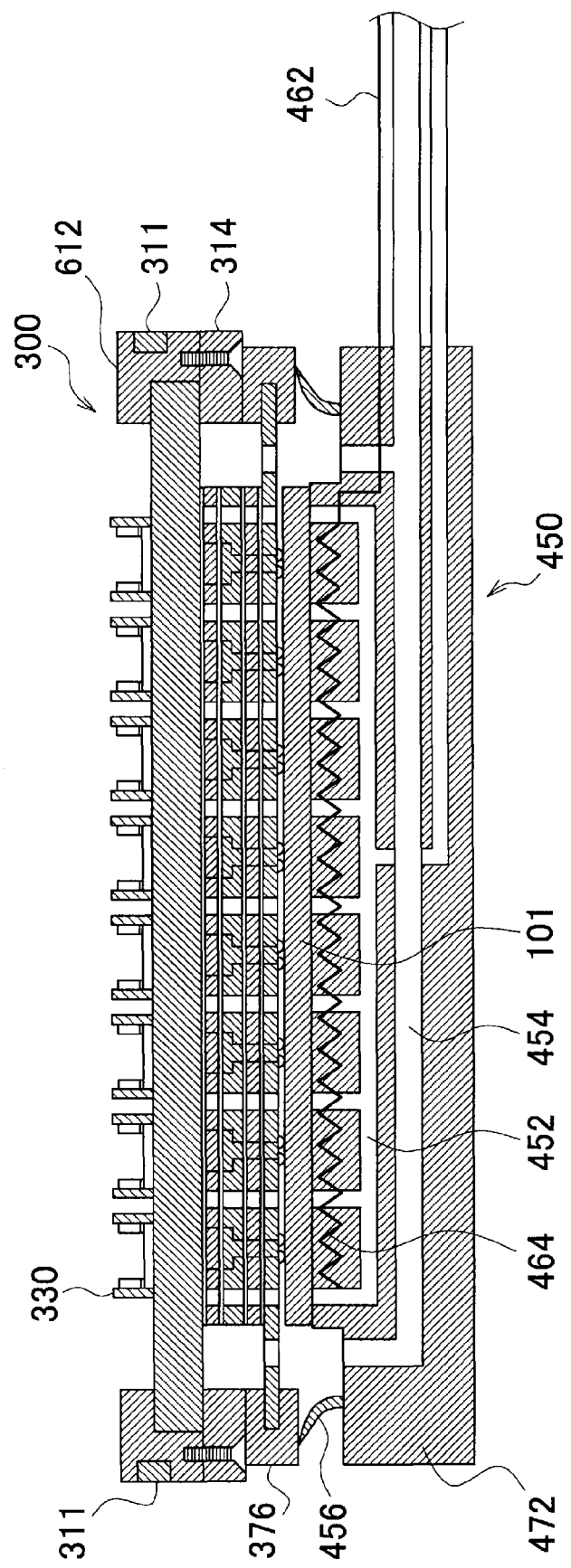
FIG. 19 is a cross-sectional view of the probe card 300, the wafer 101, and the wafer tray 450.

FIG. 19 is a cross-sectional view of the probe card 300, the wafer 101, and the wafer tray 450 being moved integrally. Components that are the same as those in other Figures are given the same reference numerals and redundant descriptions are omitted.

In the cross sections described using FIGS. 15 and 16, the probe card 300 is fixed to the chassis 401 by the upper frame 312. However, when the probe card 300, the wafer 101, and the wafer tray 450 are moved integrally, the probe card is configured to be attachable to and detachable from the chassis 401.

More specifically, an upper frame 612 is used instead of the upper frame 312 described in relation to FIG. 6. The outer edge of the upper frame 612 has the same shape as the outer edge of the lower frame 314. Therefore, the probe card 300, the wafer 101, and the wafer tray 450 can be integrally moved downward away from the contactor 202 without interfering with the chassis 401.

On the other hand, when the probe card 300, the wafer 101, and the wafer tray 450 are integrally attached to the contactor 202, the microscopes 430 observe the guide unit 330 to perform alignment and the alignment stage 410 is raised vertically. In this case, in comparison to the alignment of the wafer 101, there is a large amount of leeway with respect to the necessary alignment accuracy of the guide unit 330, and therefore alignment can be performed quickly and easily. The size of the guide unit 330 allows alignment with the pre-alignment accuracy to be achieved without needing observation with the microscopes 430.

The upper frame 612 includes connecting portions 311 and the chassis 401 includes electromagnets corresponding to the connecting portions 311. The attractive magnetic force of these electromagnets causes the probe card 300 to be attracted to the chassis 401.

With this configuration, the probe card 300, the wafer 101, and the wafer tray 450 can be moved while maintaining the vacuum suction in the sealed space. More specifically, these components can be loaded on the alignment stage 410 and moved below an adjacent test head 200 by the stage carrier 420. In other words, the integrally formed probe card 300, wafer 101, and wafer tray 450 can be exchanged and used by each test head 200. When this exchange occurs, the exchanged integrally formed probe card 300, wafer 101, and wafer tray 450 is withdrawn by the robotic arm 116.

The following describes an exemplary modification of the wafer tray 450. In the wafer tray 450 described above, the flow passage 452 for exerting suction on the wafer 101 and the flow passage 454 for exerting suction to hold the wafer tray 450 on the bottom surface of the probe card 300 respectively use the different depressurizing sources 510 and 520. However, the flow passage 452 and the flow passage 454 within the base 472 may be formed as a single passage, and a single depressurizing source can be connected thereto via one tube and one joint running to the outside. In other words, by connecting the flow passage 452 and the flow passage 454 to each other within the base 472, the configuration necessary for realizing the vacuum suction can be simplified.

As another exemplary modification, a separate flow passage for circulating a cooling medium may be provided within the base 472. By circulating a cooling medium within the base 472, the loading surface 474 can be cooled as well as heated. More specifically, by forming the flow passage for circulating the cooling medium in the same manner as the flow passages 452 and 454, this flow passage can be connected to an external cooling device or to the cooler 140 by a tube. With this configuration, the testing can be begun quickly when the test head 200 performs sequential testing at various temperatures. Furthermore, a thermal medium may be circulated instead of the cooling medium. By using a configuration for circulating a thermal medium, there is more freedom when selecting a test temperature.

After testing, the wafer 101 is removed from the wafer tray 450. After this, until another wafer 101 is loaded into the wafer tray 450, a dummy wafer is preferably loaded in the wafer tray 450 and held integrally with the probe card 300 in a standby state. When the dummy wafer is held in the sandwiched standby state, the bumps 373 of the membrane unit 370 of the probe card 300 are prevented from being exposed to the external atmosphere and damage due to contact between the wafer tray 450 and the openings 458 is prevented.

Furthermore, until another wafer 101 is loaded into the wafer tray 450, the heating state of the heater 464 is preferably maintained. With this control, the new wafer 101 to be tested can quickly reach the desired temperature. This also reduces degradation caused by temperature change of the probe card 300. In this case as well, it is preferable that a dummy wafer be sandwiched integrally in a standby state.

The above processes performed until a new wafer 101 to be tested is loaded onto the wafer tray 450 can be used for both the configuration described in FIGS. 15 and 16 where the probe card 300 is fixed to the chassis 401 by the upper frame 312 and for the configuration described in FIG. 19 where the probe card 300 can be attached to and removed from the chassis 401.

Figure 20:
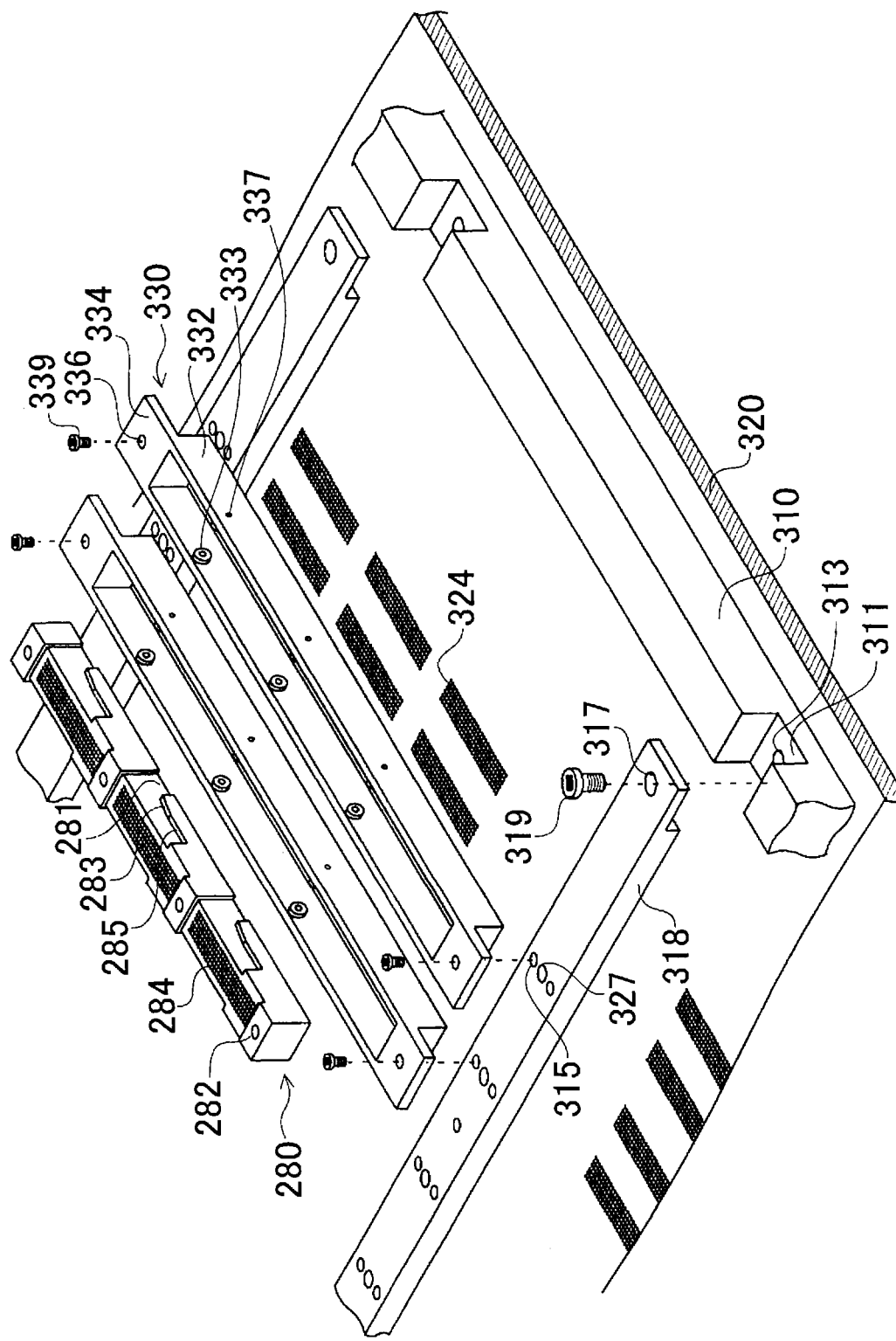
FIG. 20 is an exploded perspective view of the area around a guide unit 330.

FIG. 20 is an exploded perspective view of the area around guide units 330 having a different configuration. Aside from the points described below, the test apparatus 100 has the same configuration as the test apparatuses 100 described above, and therefore identical components are given the same reference numerals and redundant descriptions are omitted.

In FIG. 20, the test head 200 side shows a single contactor housing 280. The probe card 300 side shows a stiffener 310, a circuit board 320, and guide units 330.

The contactor housing 280 has the same configuration as shown in FIG. 11, but the stepped inclined portions 283 and flat portions 285 formed on the sides are shortened. The positions and widths of the passing sections remain unchanged.

The stiffener 310 includes crossing members 318. The ends of each crossing member 318 include screw holes 317. Two types of screw holes 315 and 327 are arranged in each crossing member 318 at intervals substantially equal to the intervals at which the guide units 330 are arranged. Furthermore, connecting portions 311 having shapes that are complementary to the ends of the crossing members 318 are formed on the top surface of the stiffener 310. Screw holes 313 are formed in the connecting portions 311.

The crossing members 318 are firmly connected to the stiffener 310 by screws 319 inserted through the screw holes 317 and screwed into the screw holes 313. As a result, the stiffener 310 and the crossing members 318 are formed integrally, and exhibit a high degree of rigidity. The function of the screw holes 327 is described further below.

Each guide unit 330 includes a channel member 332, rollers 333, and joining portions 334. The channel member 332 has an open top and bottom, and a pair of sidewalls that are parallel to each other. The rollers 333 are arranged at uniform intervals on the inner walls of the channel member 332. Each roller 333 is mounted to rotate on a spindle 337. In each guide unit 330, the rollers 333 do not move.

The joining portions 334 are arranged at the longitudinal ends of each guide unit 330, and include screw holes 336. By inserting the screws 339 through the screw holes 336 and screwing the screws 339 into the screw holes 315 of the crossing members 318, the guide units 330 can be fixed to the crossing members 318.

The circuit board 320 includes a plurality of pad groups 324 on the top surface thereof. These pad groups 324 are slightly offset to the right side of FIG. 20. In this way, the circuit board 320 may include the stiffener 310 and the crossing members 318 that are connected to the guide units 330 and that bias the guide units 330 in the direction of the circuit board 320.

Figure 21:
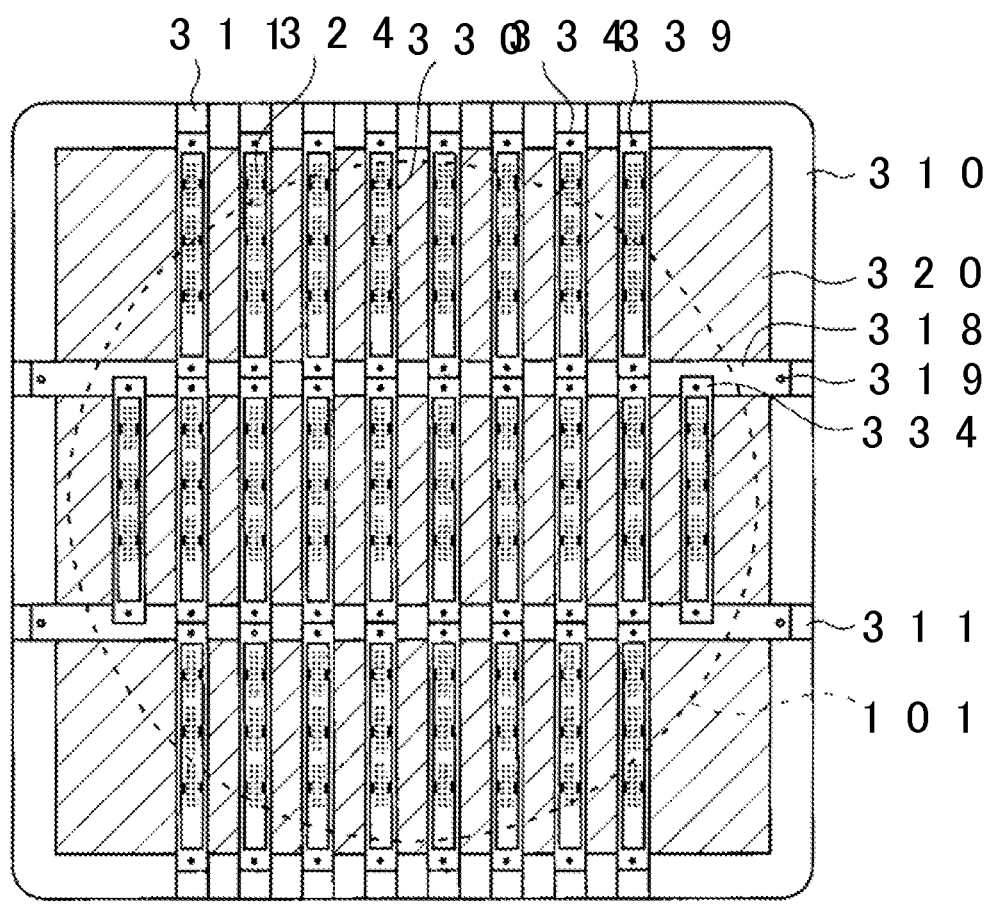
FIG. 21 is a planar view of the probe card 300.

FIG. 21 is a planar view of the probe card 300. The probe card 300 includes a stiffener 310, a circuit board 320, and guide units 330.

The stiffener 310 is a square frame. Two crossing members 318 are arranged on the stiffener 310 in parallel with the top and bottom of the stiffener 310. The ends of each crossing member 318 are screwed down to the connecting portions 311 of the stiffener 310 by the screws 319.

A plurality of guide units 330 are arranged orthogonal to the crossing members 318. The guide units 330 arranged between the pair of crossing members 318 each have the joining portions 334 at the ends thereof screwed to the crossing members 318 by the screws 339.

The guide units 330 arranged between a crossing member 318 and the top or bottom of the stiffener 310 each have the joining portion 334 at one end thereof screwed to the stiffener 310 and the joining portion 334 at the other end thereof screwed to the crossing member 318 by the screws 339. Therefore, connecting portions 311 for the joining portions 334 of the guide units 330 are formed at the top and bottom of the stiffener 310.

The pad groups 324 are positioned within the guide units 330 fixed to the stiffener 310 and the crossing members 318. Here, the pad groups 324 are each offset to one longitudinal end of each guide unit 330, which is toward the top in FIG. 21.

In this way, a probe card 300 is formed that electrically connects a contactor 202 on a test apparatus 100 side to test pads on a wafer 101. This probe card 300 includes a circuit board 320 having pad groups 324 on the top surface thereof corresponding to the test pads and guide units 330 that are arranged on a surface of the circuit board 320 and that guide the contactor 202 to the circuit board 320 to press spring pins 286 of the contactor 202 against the pad groups 324 of the circuit board 320.

Figure 22:
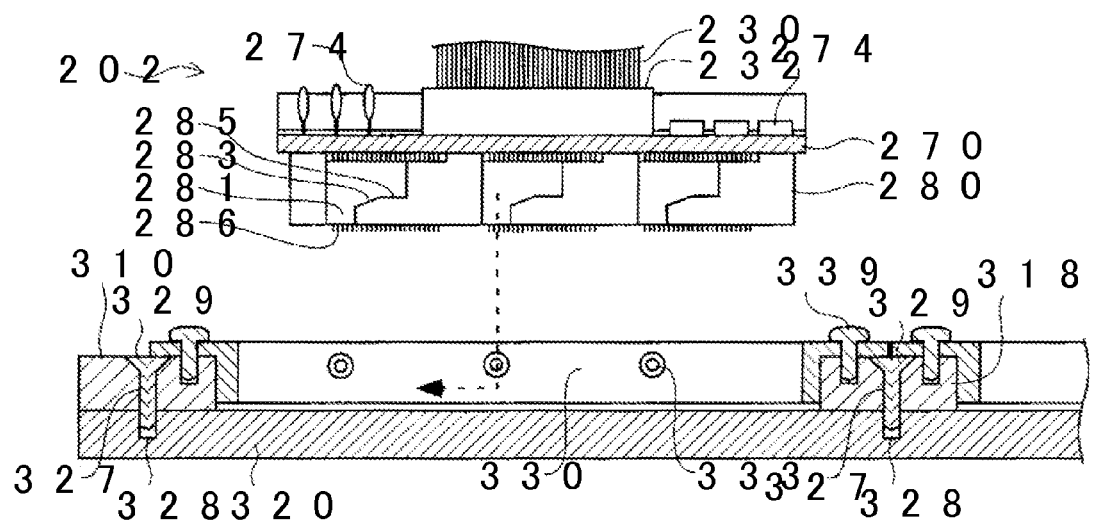
FIG. 22 is a schematic view showing movement of the contactor 202.

FIG. 22 is a schematic view showing the movement of the contactor 202 toward the probe card 300 described above. The circuit board 320 forming the top surface of the probe card 300 is screwed on by screws 329 inserted into the screw holes 327 of the stiffener 310 or the crossing members 318.

Here, the circuit board 320 includes non-through-holes 328 that serve as screw holes into which the screws 329 are screwed. By using the non-through-holes 328 as the screw holes in this way, the circuit board 320 is prevented from being penetrated front to back by the screw holes, thereby sealing the inside of the probe card 300 in an airtight manner.

When forming an electrical connection with the probe card 300 described above, the contactor 202 drops vertically down onto the circuit board 320, as shown by the dotted line in FIG. 22, at a position by which the rollers 333 pass through the passing portions 281 of the contactor housing 280. The contactor housing 280, in which the bottom ends of the spring pins 286 protrude from the bottom surface thereof to contact the top surface of the circuit board 320, is guided by the guide unit 330 to move horizontally along the front surface of the circuit board 320.

Here, by moving the contactor housing 280 such that the rollers 333 pass over the inclined portions 283 to reach the flat portions 285, the guide unit 330 is pressed against the circuit board 320 by the side surface of the contactor housing 280 housing the spring pins 286.

Eventually, the spring pins 286 contact the corresponding contact pads 321 among the offset pad groups 324. As a result, a path for an electric signal is formed from the probe card 300 to the contactor 202. Since the surface oxide or the like of the contact pads 321 and the spring pins 286 is removed due to the self cleaning performed by the sliding of the spring pins 286 sliding on the circuit board 320, a favorable connection can be achieved between the spring pins 286 and the contact pads 321.

In the examples shown in FIGS. 11 and 20, the contactor housing 280 having stepped portions on the side surfaces thereof and the guide units 330 having rollers 333 press the spring pins 286 toward the contact pads 321. On the other hand, in the example shown below, engaging pins are formed on the side surfaces of the contactor housing 280 and grooved cams are formed on the probe card 300 side.

Figure 23:
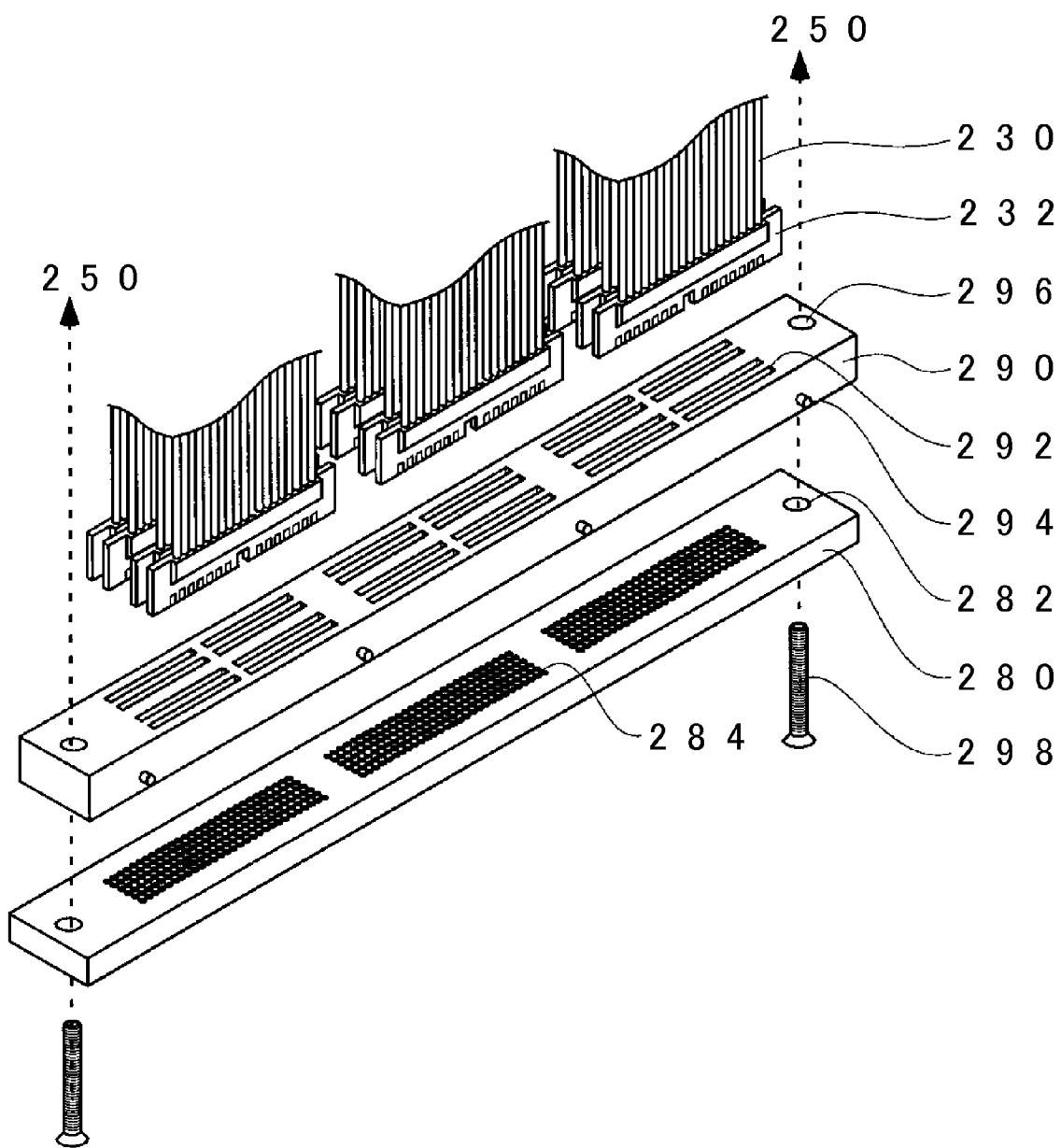
FIG. 23 is a perspective view of another configuration of a region around the contactor 202.

FIG. 23 is a perspective view of another configuration of a test head 200 of the test apparatus 100 near the contactor 202. The contactor 202 includes a contactor housing 280 and a socket 290.

The contactor housing 280 includes screw holes 282 and housing holes 284. The housing holes 284 pass through the contactor housing 280 in the height direction. Each housing hole 284 has a spring pin 286 inserted therethrough. The screw holes 282 also pass through the contactor housing 280 in the height direction. A screw 298 is inserted into each screw hole 282 from below.

The socket 290 includes receptacles 292, engaging pins 294, and screw holes 296. The receptacles 292 have shapes that are complementary to the connector housings 232 at the bottom of flat cables 230.

The screw holes 296 penetrate through the sockets 290 in the height direction. The tips of the screws 298 inserted through the screw holes 282 of the contactor housing 280 are further inserted through the screw holes 296. The top ends of the screws 298 are connected to the three-dimensional actuator 250 of the test head 200. As a result, the contactor housing 280 is attached to the test head 200 and can move vertically and horizontally according to the movement of the three-dimensional actuator 250.

The contactor housing 280 and the socket 290 are layered and firmly attached to each other, and are electrically connected to each other by wiring that is not shown. As a result, the end of each flat cable 230 connected on the test head 200 side is electrically connected to spring pins 286 of the contactor housing 280.

The engaging pins 294 protrude perpendicularly from the side surfaces of the socket 290. The function of the engaging pin 294 is described further below.

Figure 24:
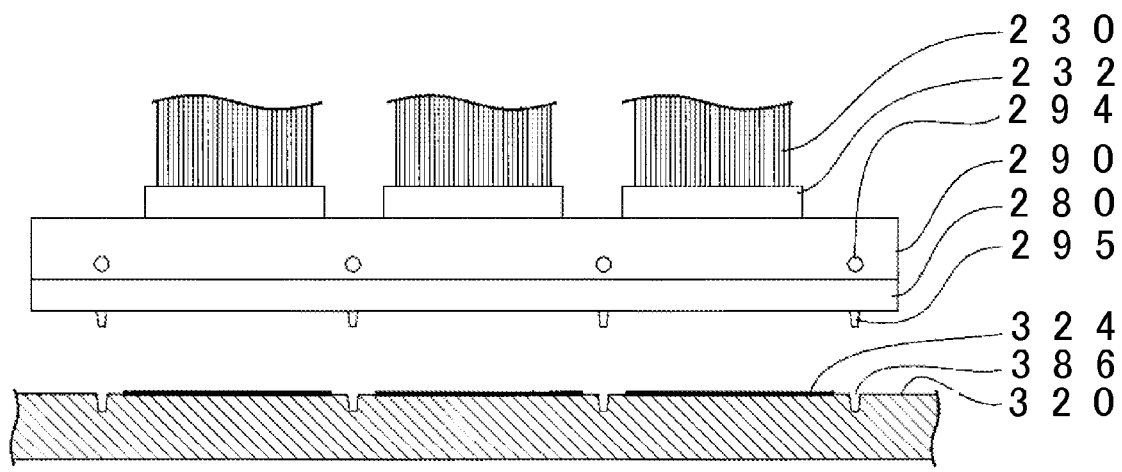
FIG. 24 is a side view of a contactor 202.

FIG. 24 is a side view of a contactor 202. Components that are the same as those in FIG. 23 are given the same reference numerals and redundant descriptions are omitted.

As shown in FIG. 24, guide pins 295 are arranged on the bottom surface of the contactor housing 280 to protrude downward. The guide pins 295 engage with guide holes 386 formed on the top surface of the circuit board 320, thereby fixing the position of the contactor housing 280 on the circuit board 320.

Figure 25:
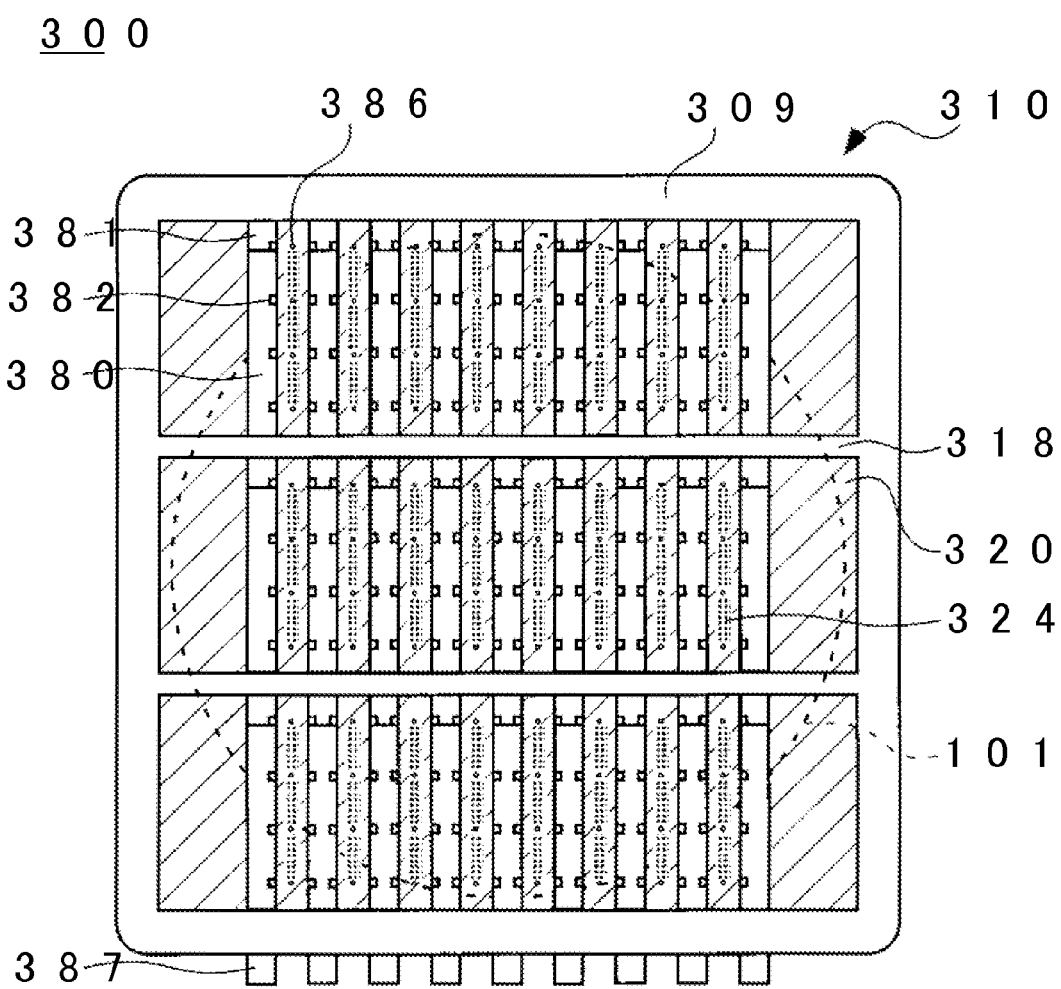
FIG. 25 is a planar view of the probe card 300.

FIG. 25 is a planar view of the probe card 300 corresponding to the contactor 202 described above. The probe card 300 includes a stiffener 310, a circuit board 320, and guide bars 380.

The circuit board 320 has a square shape that substantially circumscribes the wafer 101 being tested. Pad groups 324 and guide holes 386 are arranged at regular intervals on the top surface of the circuit board 320. The stiffener 310 is made of a frame member 309 that encompasses the entire circuit board 320 and two crossing members 318 that are formed integrally with the frame member 309 and connect a pair of parallel sides of the frame member 309 to each other.

The guide bars 380 are arranged in parallel at intervals equal to the width of the contactor housing 280 and are oriented to be orthogonal to the crossing members 318. Each guide bar 380 includes a stepped portion 381 and grooved cams 382. The stepped portions 381 are formed by decreasing the height of the guide bars 380 in a region adjacent to the stiffener 310. The grooved cams 382 are formed on the side surfaces of the guide bars 380.

As described further below, each crossing member 318 has a length greater than the depth of the stiffener 310, which is the height in FIG. 25, and penetrates through the crossing members 318 and the frame member 309 of the stiffener 310. Therefore, the ends 387 of the guide bars 380 protrude from the bottom end of the frame member 309.

When the protruding ends 387 are pressed in the longitudinal direction of the guide bars 380, the guide bars 380 move in the direction in which they are pressed. As a result, the ends 387 of the guide bars 380 enter into the frame member 309 of the stiffener 310, such that the top ends of the guide bars 380 protrude from the top end of the stiffener 310.

FIG. 26 is a partial enlarged perspective view of a portion of the probe card 300. Components that are the same as those in FIG. 25 are given the same reference numerals and redundant descriptions are omitted.

Outside the stiffener 310, the ends 387 of the guide bar 380 protrude down and to the right from the frame member 309 of the stiffener 310. Inside the stiffener 310, at the end opposite the ends 387, there are stepped portions where the height of the guide bars 380 is decreased immediately in front of the crossing member 318 of the stiffener 310. As a result, when the ends 387 are pressed, the guide bars 380 move until the rising surfaces of the stepped portions 381 contact the crossing member 318.

L-shaped grooved cams 382 are arranged on the side surfaces of each guide bar 380. Each grooved cam 382 has, over its entire length, a width that is greater than the diameter of each engaging pin 294 on a side surface of the socket 290. The downward-facing surface inside each grooved cam 382 has a slope that drops as it proceeds deeper into the grooved cam 382. The grooved cams 382 arranged in regions overlapping with the steps 381 do not have vertical portions, but the flat portions are identical to those of the other grooved cams 382.

When the contactor 202 drops between the guide bars 380 described above, the contactor housing 280 drops while having the side surfaces thereof guided by the stiffener 310 and the guide bar 380, such that the bottom ends of the guide pins 295 eventually enter into the guide holes 386. By guiding the guide pins 295 with the guide holes 386, the pad groups 324 can be accurately aligned with the bottom ends of the spring pins 286 held by the contactor housing 280.

Furthermore, the engaging pins 294 arranged on the side surfaces of the socket 290 enter into the grooved cams 382 of the guide bar 380. The contactor 202 drops until the engaging pins 294 contact the bottom surfaces of the grooved cams 382, at which point the actuator, not shown, causes the ends 387 of the guide bar 380 to all be pressed in the longitudinal direction. As a result, the grooved cams 382 also move such that the engaging pins 294 are pressed downward according to the slanted top surfaces of the grooved cams 382. In light of this movement, the engaging pins 294 may be configured to rotate in the manner of the rollers 333.

The guide bars 380 are supported by being sandwiched between the stiffener 310 and the circuit board 320, and therefore the movement described above causes the socket 290 and the contactor housing 280 to be pulled toward the circuit board 320. Each spring pin 286 held by the contactor housing 280 is pressed against a pad formed in a pad group 324, thereby forming a favorable electric connection between the pads and the spring pins 286.

The configurations shown in FIGS. 23 to 26 handle both the guiding and the pulling of the contactor housing 280 by the guide bars 380. Therefore, compared to the configurations shown in FIGS. 11, 12, and 20 to 22, the configurations of FIGS. 23 to 26 are simplified by having fewer components. Despite this, these configurations achieve the same functions as other embodiments.

Figure 27:
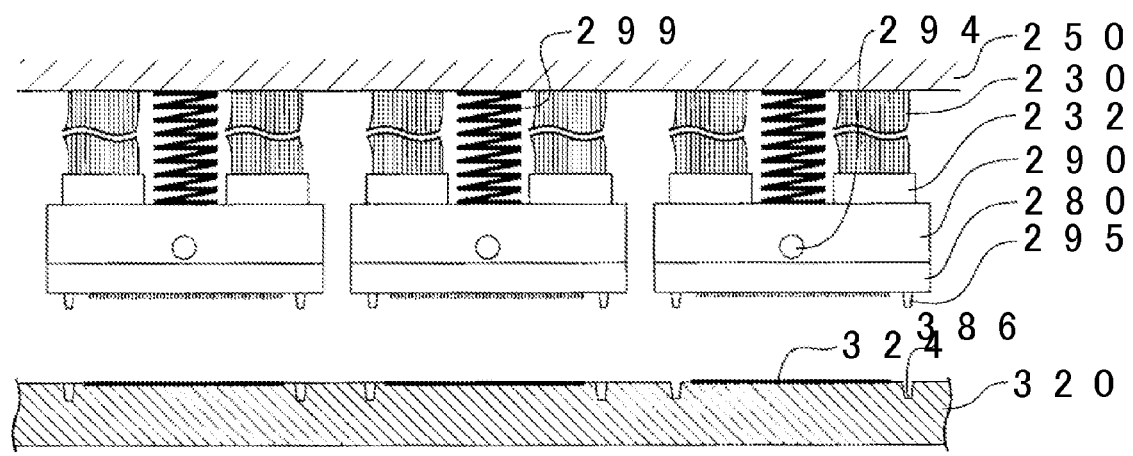
FIG. 27 is a side view of another configuration of a contactor 202.

FIG. 27 is a side view of another configuration of a contactor 202. In the example of FIG. 26, the spring pins 286 corresponding to the pad groups 324 are held by a single contactor housing 280.

However, as shown in FIG. 27, a plurality of independent contactor housings 280 may be used for each pad group 324. Furthermore, the contactor housings 280 and the sockets 290 are each independently supported from the three-dimensional actuator 250 via a spring 299.

As a result, the each contactor housing 280 is independently guided by a guide pin 295 to be independently positioned, and therefore the unavoidable dimensional errors on the circuit board 320 side are prevented from being combined with the unavoidable dimensional errors on the contactor 202 side. Accordingly, the high positional precision is achieved in all regions of the circuit board 320, thereby forming a favorable electric connection.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can provide a wafer tray that is used by a test apparatus for testing a plurality of devices under test formed on a semiconductor wafer, the wafer tray comprising a first flow passage for fixing the semiconductor wafer to the wafer tray using vacuum suction; a second flow passage for fixing the wafer tray to the test apparatus using vacuum suction; and a heater for heating a loading surface on which at least the semiconductor wafer is loaded.

What is claimed is:

1. A test apparatus for testing a plurality of devices under test formed on a semiconductor wafer using a wafer tray including a first flow passage for fixing the semiconductor wafer to the wafer tray using vacuum suction, a second flow passage for fixing the wafer tray to the test apparatus using vacuum suction, and a heater for heating a loading surface on which at least the semiconductor wafer is loaded, the test apparatus comprising:
   a first exhaust apparatus connected to the first flow passage;
   a second exhaust apparatus connected to the second flow passage; and
   a control section for controlling drive of the first exhaust apparatus and drive of the second exhaust apparatus such that a vacuum degree of the first flow passage is greater than a vacuum degree of the second flow passage.

2. The test apparatus according to claim 1, wherein the wafer tray further comprises a third flow passage that circulates a thermal medium or a cooling medium for cooling at least the loading surface.

3. The test apparatus according to claim 1 further comprising:
   a probe card having a contact surface that is layered on the semiconductor wafer and on which is arranged electrical contact points, the electrical contact points connected respectively to electrical contact points of the devices under test, wherein
   the wafer tray is fixed to the test apparatus by vacuum suction achieved using a sealed space formed between the wafer tray and the probe card.

4. The test apparatus according to claim 3, wherein the probe card is formed of at least a circuit board, which is a hard substrate, and a membrane unit having an elastic sheet on which the electrical contact points are arranged, and
   the sealed space is formed between the wafer tray and the circuit board via a through-hole provided in the membrane unit.

5. The test apparatus according to claim 3, wherein
   the probe card can be attached to and detached from the test apparatus, and
   the probe card, the wafer, and the wafer tray can move integrally while maintaining, the vacuum suction of the sealed space.

6. The test apparatus according to claim 3, wherein
   when the semiconductor wafer is not loaded on the wafer tray, the wafer tray has a dummy wafer loaded thereon and is fixed to the test apparatus.

7. A test apparatus for testing a plurality of devices under test formed on a semiconductor wafer using a wafer tray including a first flow passage for fixing the semiconductor wafer to the wafer tray using vacuum suction, a second flow passage for fixing the wafer tray to the test apparatus using vacuum suction, and a heater for heating a loading surface on which at least the semiconductor wafer is loaded, the test apparatus comprising:
   a probe card having a contact surface that is layered on the semiconductor wafer and on which is arranged electrical contact points, the electrical contact points connected respectively to electrical contact points of the devices under test, wherein
   the wafer tray is fixed to the test apparatus by vacuum suction achieved using a sealed space formed between the wafer tray and the probe card,
   the probe card is formed of at least a circuit board, which is a hard substrate, and a membrane unit having an elastic sheet on which the electrical contact points are arranged, and
   the sealed space is formed between the wafer tray and the circuit board via a through-hole provided in the membrane unit.

8. The test apparatus according to claim 7, wherein
   the probe card can be attached to and detached from the test apparatus, and
   the probe card, the wafer, and the wafer tray can move integrally while maintaining the vacuum suction of the sealed space.

9. The test apparatus according to claim 7, wherein
   when the semiconductor wafer is not loaded on the wafer tray, the wafer tray has a dummy wafer loaded thereon and is fixed to the test apparatus.

10. A test apparatus for testing as plurality of devices under test formed on a semiconductor wafer using a wafer tray including a first flow passage, for fixing the semiconductor wafer to the wafer tray using vacuum suction, a second flow passage for fixing the wafer tray to the test apparatus using vacuum suction, and a heater for heating a loading surface on which at least the semiconductor wafer is loaded, wherein the first flow passage and the second flow passage are connected to each other in the wafer tray, the test apparatus comprising:
   a probe card having a contact surface that is layered on the semiconductor wafer and on which is arranged electrical contact points, the electrical contact points connected respectively to electrical contact points of the devices under test, wherein
   the wafer tray is fixed to the test apparatus by vacuum suction achieved using a sealed space formed between the wafer tray and the probe card,
   the probe card can be attached to and detached from the test apparatus, and the probe card, the wafer, and the wafer tray can move integrally while maintaining, the vacuum suction of the sealed space.

11. A test apparatus for testing a plurality of devices under test formed on a semiconductor wafer using a wafer tray including a first flow passage for fixing the semiconductor wafer to the wafer tray using vacuum suction, a second flow passage for fixing the wafer tray to the test apparatus using vacuum suction, and a heater for heating a loading surface on which at least the semiconductor wafer is loaded wherein the first flow passage and the second flow passage are connected to each other in the wafer tray, the test apparatus comprising:
   a probe card having a contact surface that is layered on the semiconductor wafer and on which is arranged electrical contact points, the electrical contact points connected respectively to electrical contact points of the devices under test, wherein
   the wafer tray is fixed to the test apparatus by vacuum suction achieved using a sealed space formed between the wafer tray and the probe card,
   the probe card is formed of at least a circuit board, which is a hard substrate, and a membrane unit having an elastic sheet on which the electrical contact points are arranged, and
   the sealed space is formed between the wafer ray and the circuit board via a through-hole provided in the membrane unit.

12. A test apparatus for testing a plurality of devices under test formed on a semiconductor wafer using a wafer tray including a first flow passage for fixing the semiconductor wafer to the wafer tray using vacuum suction, a second flow passage for fixing the wafer tray to the test apparatus using vacuum suction, a heater for heating a loading surface on which at least the semiconductor wafer is loaded, and a third flow passage that circulates a thermal medium or a cooling medium for cooling at least the loading surface, wherein the first flow passage and the second flow passage are connected to each other in the wafer tray, the test apparatus comprising:
   a probe card having a contact surface that is layered on the semiconductor wafer and on which is arranged electrical contact points, the electrical contact points connected respectively to electrical contact points of the devices under test, wherein
   the wafer tray is fixed to the test apparatus by vacuum suction achieved using a sealed space formed between the wafer tray and the probe card,
   the probe card is formed of at least a circuit board, which is a hard substrate, and a membrane unit having an elastic sheet on which the electrical contact points are arranged, and
   the sealed space is formed between the wafer tray and the circuit board via a through-hole provided in the membrane unit.

13. A test apparatus for testing a plurality of devices under test formed on a semiconductor wafer using a wafer tray including a first flow passage for fixing, the semiconductor wafer to the wafer tray using vacuum suction, a second flow passage for fixing the wafer tray to the test apparatus using vacuum suction, a heater for heating a loading surface on which at least the semiconductor wafer is loaded, and a third flow passage that circulates a thermal medium or a cooling medium for cooling at least the loading surface, wherein the first flow passage and the second flow passage are connected to each other in the wafer tray, the test apparatus comprising:
   a probe card having a contact surface that is layered on the semiconductor wafer and on which is arranged electrical contact points, the electrical contact points connected respectively to electrical contact points of the devices under test, wherein
   the wafer tray is fixed to the test apparatus by vacuum suction achieved using a sealed space formed between the wafer tray and the probe card,
   the probe card can be attached to and detached from the test apparatus, and
   the probe card, the wafer, and the wafer tray can move integrally while maintaining, the vacuum suction of the sealed space.

* * * * *